(12) United States Patent
Iizuka et al.

(10) Patent No.: US 8,758,511 B2
(45) Date of Patent: Jun. 24, 2014

(54) FILM FORMING APPARATUS AND VAPORIZER

(75) Inventors: Hachishiro Iizuka, Nirasaki (JP); Akira Yasumuro, Nirasaki (JP); Koichiro Kimura, Nirasaki (JP); Norihiko Tsuji, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 2017 days.

(21) Appl. No.: 11/660,091

(22) PCT Filed: Aug. 12, 2005

(86) PCT No.: PCT/JP2005/014850
§ 371 (c)(1),
(2), (4) Date: Feb. 13, 2007

(87) PCT Pub. No.: WO2006/016677
PCT Pub. Date: Feb. 16, 2006

(65) Prior Publication Data
US 2007/0266944 A1    Nov. 22, 2007

(30) Foreign Application Priority Data

Aug. 13, 2004 (JP) ................................ 2004-235872
Jan. 28, 2005 (JP) ................................ 2005-022181

(51) Int. Cl.
*C23C 16/448* (2006.01)
*C23C 16/455* (2006.01)
*C23C 16/00* (2006.01)
*C23C 16/44* (2006.01)
*C23C 16/458* (2006.01)

(52) U.S. Cl.
CPC ......... *C23C 16/4402* (2013.01); *C23C 16/4401* (2013.01); *C23C 16/45561* (2013.01); *C23C 16/4585* (2013.01)
USPC ....................... 118/715; 118/726; 156/345.29

(58) Field of Classification Search
CPC ............ C23C 16/4481; C23C 16/4402; C23C 16/4486; C23C 14/564; C23C 16/4412; C23C 16/448; C23C 16/4482; C23C 16/4485; C23C 16/45561
USPC ............... 118/715, 726, 723 VE; 156/345.29, 156/345.33
See application file for complete search history.

(56) References Cited

U.S. PATENT DOCUMENTS 3,780,696 A * 12/1973 Babbitt et al. ................. 118/728
3,782,083 A * 1/1974 Rosenberg ....................... 55/491

(Continued)

FOREIGN PATENT DOCUMENTS

JP    3 11057    2/1991
JP    5 68826    3/1993

(Continued)

OTHER PUBLICATIONS
Japanese Office Action issued Feb. 9, 2011, in JP Application No. 2005-022181, filed Jan. 28, 2005 (with English-language translation).

*Primary Examiner* — Jeffrie R Lund
(74) *Attorney, Agent, or Firm* — Oblon, Spivak, McClelland, Maier & Neustadt, L.L.P.

(57) ABSTRACT

A film forming apparatus including a raw material supplying section for supplying a raw material of a liquid or a gas-liquid mixture, a raw material vaporizing section for vaporizing the raw material to form a raw material gas, and a film forming section for conducting a film forming treatment using the formed raw material gas, and a filter on the transport path for the raw material gas from the raw material vaporizing section to the film forming section. An outer edge of the filter is pressed to the inner surface of the transport path over the whole perimeter thereof by a cyclic supporting member, which is less prone to be deformed by a loading in the pressing direction than the outer edge, and is fixed to the inner surface of the transport path in a compressed state between the inner surface of the transport path and the supporting member.

25 Claims, 18 Drawing Sheets

(56) References Cited

U.S. PATENT DOCUMENTS

| | | | |
|---|---|---|---|
| 3,932,153 A * | 1/1976 | Byrns | 55/511 |
| 4,223,048 A * | 9/1980 | Engle, Jr. | 438/788 |
| 4,253,932 A * | 3/1981 | Mose et al. | 204/253 |
| 4,724,621 A * | 2/1988 | Hobson et al. | 34/218 |
| 5,156,820 A * | 10/1992 | Wong et al. | 422/186.05 |
| 5,304,248 A * | 4/1994 | Cheng et al. | 118/728 |
| 5,451,258 A * | 9/1995 | Hillman et al. | 118/715 |
| 5,529,634 A * | 6/1996 | Miyata et al. | 118/726 |
| 5,536,324 A * | 7/1996 | Fuchita | 118/726 |
| 5,779,804 A * | 7/1998 | Mikoshiba et al. | 118/726 |
| 5,882,416 A * | 3/1999 | Van Buskirk et al. | 118/726 |
| 5,885,356 A * | 3/1999 | Zhao et al. | 118/723 ER |
| 6,863,835 B1 * | 3/2005 | Carducci et al. | 216/63 |
| 7,163,197 B2 * | 1/2007 | Yoshioka et al. | 261/78.2 |
| 7,182,816 B2 * | 2/2007 | Kleshock et al. | 118/715 |
| 7,288,223 B2 * | 10/2007 | Becker et al. | 264/267 |
| 7,422,198 B2 * | 9/2008 | Yoshioka et al. | 261/130 |
| 7,534,348 B2 * | 5/2009 | Reitz et al. | 210/232 |
| 7,547,003 B2 * | 6/2009 | Okabe et al. | 261/78.2 |
| 7,637,482 B2 * | 12/2009 | Yoshioka et al. | 261/43 |
| 7,666,260 B2 * | 2/2010 | Iizuka | 118/726 |
| 7,731,162 B2 * | 6/2010 | Yoshioka et al. | 261/49 |
| 7,740,739 B2 * | 6/2010 | Nishio et al. | 156/345.51 |
| 7,883,076 B2 * | 2/2011 | Okabe et al. | 261/142 |
| 8,168,001 B2 * | 5/2012 | Uchida et al. | 118/715 |
| 2001/0032590 A1 * | 10/2001 | Carducci et al. | 118/723 E |
| 2002/0043215 A1 * | 4/2002 | Yoshioka et al. | 118/715 |
| 2003/0198741 A1 | 10/2003 | Uchida et al. | |
| 2006/0054087 A1 * | 3/2006 | Seo et al. | 118/715 |
| 2007/0101940 A1 * | 5/2007 | Iizuka | 118/726 |
| 2007/0266944 A1 * | 11/2007 | Iizuka et al. | 118/722 |

FOREIGN PATENT DOCUMENTS

| | | |
|---|---|---|
| JP | 7 94426 | 4/1995 |
| JP | 10-275803 | 10/1998 |
| JP | 11 81981 | 3/1999 |
| JP | 2000 73175 | 3/2000 |
| JP | 2000 161565 | 6/2000 |
| JP | 2002 134594 | 5/2002 |
| JP | 2004 6554 | 1/2004 |
| JP | 2004 87585 | 3/2004 |
| JP | 2004 211183 | 7/2004 |
| KR | 2003-0083581 | 10/2003 |

* cited by examiner

FILM FORMING APPARATUS AND VAPORIZER

FIELD OF THE INVENTION

The present invention relates to a film forming apparatus; and, more particularly, to a configuration of a film forming apparatus for performing a film formation by using a source gas obtained by vaporizing source material such as an organic metal in a liquid or a gas-liquid mixed state. Further, the present invention also relates to a vaporizer adapted for use in the film forming apparatus.

BACKGROUND OF THE INVENTION

There has been proposed a film forming apparatus, e.g., a CVD (chemical vapor deposition) apparatus, for performing a film formation by using a source gas generated by vaporizing a liquid source material of an organic metal or a liquefied source material of an organic metal dissolved in a solvent. A typical example of such a film forming apparatus is an MO (metal organic) CVD apparatus, which is employed in forming a high-k dielectric thin film of, e.g., a PZT (Pb—Zr—Ti oxide), a BST (Ba—Sr—Ti oxide), and the like; a metal thin film of, e.g., tungsten (W); a semiconductor thin film of, e.g., InP (see, e.g., JP10-177971A); and so forth. The CVD can be classified into a thermal CVD, an optical CVD, a plasma CVD, and so forth depending on the type of energy supplied to trigger a chemical reaction.

In the film forming apparatus described above, fine particles (hereinafter, simply referred to as "particles") are often generated inside of the vaporizer or in a transport path of a source gas leading to a film forming vessel as a result of solidification or decomposition of source material. The particles thus generated may be introduced into a film forming chamber to be deposited on a substrate, resulting in degradation of a film quality and product failure such as deterioration of an insulation property.

To prevent the problems, there have been proposed a configuration in which a filter is disposed at an outlet of the vaporizer (see, e.g., JP7-94426A); a configuration in which a filter (line filter) is disposed between a gas supply source and the film forming chamber (see, e.g., JP5-68826A); and the like. In these configurations, particles flown from the upstream side of the filters are trapped by the filters, so that the particles are prevented from being flown to the downstream side of the filters, and thus the amount of particles introduced into the film forming chamber can be reduced.

However, in the above methods, though the filters trap the particles flown from the upstream sides, the amount of particles reaching the substrate in the film forming chamber cannot be reduced sufficiently. Though the reason for this is not clearly found out, it is conjectured that, for example, fine particles grow at the downstream sides of the filters after passing through meshes of the filters or fine droplets (residual mist) of the source material become particles at the downstream sides of the filters after passing therethrough.

To prevent these problems, it is considered to improve the trapping efficiency of the filters by means of reducing the size of the meshes of the filters, thus allowing the fine particles or the fine droplets of the source material to be trapped by the filters. However, if the sizes of the meshes are reduced, the filters would be clogged shortly, and in such case, a repair and maintenance work of cleaning or replacing the filters need to be performed more frequently so as to maintain a set supply flow rate of the source gas.

Moreover, particles can also be generated inside the film forming chamber as a result of deposits being peeled off inner surfaces of the chamber or vicinities of the susceptor. Such a problem may not be avoided by reducing the amount of the particles introduced into the film forming chamber from a gas supply line by the filters.

SUMMARY OF THE INVENTION

The present invention is to solve the aforementioned problems; and it is, therefore, an object of the present invention to provide a structure capable of reducing the amount of particles more efficiently in a film forming apparatus having a filter disposed in a transport path of a source gas.

It is another object of the present invention to provide a structure capable of reducing the frequency of maintenance works, while maintaining a sufficient filtering efficiency.

It is still another object of the present invention to provide a structure capable of reducing the amount of particles generated in the film forming chamber, thus preventing various problems that might be caused by the presence of the particles.

It is a fourth object of the present invention to provide a vaporizer having a filter capable of reducing the amount of particles.

The inventors of the present invention have investigated the reasons why the amount of particles introduced into a film forming vessel does not decrease sufficiently in a film forming apparatus in which a filter is disposed in a transport path of a source gas and found out that there is a gas stream passing through a gap between the inner surface of the transport path and the filter.

A conventional filter is formed by clipping a front and a rear surface of an outer peripheral portion of a filter material with a pair of ring-shaped thin plate members made up of metal and then welding outer peripheries of the thin plate members to form a united body, wherein the filter material is obtained by pressing and hardening metal fiber or ribbon material of metal. Further, attachment holes are formed at the outer peripheral portion of the filter through the pair of thin plate members. By screwing bolts through the attachment holes to fix them to the inner surface of the transport path, the filter is fastened to the inner surface of the transport path.

However, at the outer peripheral portion of the filter, the pair of thin plate members are fixed to each other by welding. Therefore, when fastening the outer peripheral portion of the filter, parts of the thin plate members at which the bolts are screwed get deformed and locally pressed against the inner surface, causing a distortion in the outer peripheral portion of the filter, which in turn results in loose contact in the parts not fixed by the bolts (i.e., the parts between the bolts). Therefore, gaps are prone to be formed between these parts of the thin plate members and the inner surface of the transport path.

Furthermore, since the transport path of the source gas and the filter are always heated to introduce the source gas while maintaining it at a high temperature, such gaps described above might be formed or widened due to the difference between thermal expansion coefficients of the filter and the inner surface of the transport path. For example, if the filter is heated, the thin film plates are expanded further than the inner surface of the transport path, so that the not-fixed-parts of the thin plate members may be incurved, thereby enlarging the gaps. Moreover, the inventors have observed streak-shaped traces (streak-shaped patterns of attached deposits) formed by the source gas having passed through the gaps between the above-mentioned parts of the filters and parts of the inner surface of the transport path facing them.

The present invention was originated from a film forming apparatus including a source material supply unit that supplies a source material of liquid or gas-liquid mixture, a source material vaporizing unit that generates a source gas by vaporizing the source material, and a film forming unit that performs a film formation by using the generated source gas. Then, the inventors of the present invention investigated in various ways how to prevent the formation of the above-mentioned gaps to conceive the present invention.

Specifically, in accordance with a first aspect of the invention, the film forming apparatus includes a filter installed in a transport path of the source gas extending from the source material vaporizing unit to an introduction portion of the film forming unit, wherein an outer peripheral portion of the filter is pressed over an entire perimeter thereof against an inner surface of the transport path by an annular supporting member that is not deformed more easily than the outer peripheral portion of the filter by a load imposed in a pressing direction, so that the outer peripheral portion is fixed to the inner surface of the transport path while being compressed between the inner surface of the transport path and the supporting member.

In accordance with a first aspect of present invention, the outer peripheral portion of the filter can be fixed to the inner surface over the entire perimeter thereof by a substantially even pressing force, and a gap is prevented from being formed between the outer peripheral portion of the filter and the inner surface of the transport path. Therefore, the source gas is prevented from flowing through a space between the outer peripheral portion of the filter and the inner surface of the transport path. As a result, particles or unvaporized source material (residual mist) is prevented from leaking to the downstream side of the filter to thereby avoid an introduction of the particles into the film forming unit located at the downstream side of the filter.

In the first aspect of the present invention, it is preferable that a recess or a protrusion is formed at the outer peripheral portion when viewed by a cross section in a diametrical direction of the filter. Thus, an airtightness can be improved between the outer peripheral portion of the filter and the inner surface of the transport path.

Further, in accordance with a second aspect of the invention, the film forming apparatus includes a filter installed in a transport path of the source gas extending from the source material vaporizing unit to an introduction portion of the film forming unit, wherein an outer peripheral portion of the filter is pressed against and fixed to an inner surface of the transport path by an annular supporting member via an annular seal member. The annular supporting member is disposed at one side of the outer peripheral portion, and the annular seal member is disposed at the other side of the outer peripheral portion and is in direct contact with the inner surface of the transport path. Further, the supporting member is configured not to be deformed more easily than the outer peripheral portion by a load imposed in a pressing direction, and the annular seal member is configured to be deformed in the pressing direction more easily than the outer peripheral portion by the load imposed in the pressing direction.

In accordance with the second aspect of the invention, the outer peripheral portion of the filter can be fixed to the annular seal member over the entire perimeter thereof by an even pressing force, and the seal member is compressed to be deformed between the outer peripheral portion of the filter and the inner surface of the transport path by the pressing force of the supporting member. As a result, a gap is prevented from being formed between the outer peripheral portion of the filter and the inner surface of the transport path. Therefore, the source gas is prevented from flowing through the boundary between the outer peripheral portion of the filter and the inner surface of the transport path, so that particles or unvaporized source material is prevented from leaking to the downstream side of the filter.

In the first and the second aspects of the present invention, it is preferable that the outer peripheral portion of the filter is made of filter material itself. In this case, the configuration of the filter can be simplified by making, e.g., the entire part of the filter of the filter material as a unified body, and the airtightness between the outer peripheral portion and the filter material at the inner part of the filter would not be a matter of consideration any more. Therefore, the filter can be fabricated cost-effectively without sacrificing the performance of the filter.

Further, by press-fitting the outer peripheral portion made of the filter material directly to the inner surface of the transport path, the filter material is compressed and deformed to fit into an inner surface shape of the transport path, thereby allowing the filter to be fixed to the inner surface of the transport path more firmly. In addition, since the part of the filter at which it contacts the inner surface of the transport path is compressed and thus becomes compact, the airtightness can be further improved between the outer peripheral portion of the filter and the inner surface of the transport path.

In the first and the second aspect of the invention, it may also be preferable that the outer peripheral portion of the filter is formed of an outer peripheral member, the outer peripheral member being made of a material other than the filter material disposed at an inner part of the filter and connected to the filter material without any gap therebetween. By this feature, since the supporting member of a high stiffness presses the outer peripheral member over the entire perimeter thereof, the outer peripheral member is compressed and deformed to fit into the inner surface of the transport path in the first aspect of the invention, whereby the airtightness can be secured between the outer peripheral portion of the filter and the inner surface of the transport path. Further, since the supporting member of the higher stiffness presses the outer peripheral member over the entire perimeter thereof, the outer peripheral member is evenly pressed onto the seal member in the second aspect of the invention, whereby the airtightness can be secured between the outer peripheral portion of the filter and the inner surface of the transport path via the seal member.

Further, in accordance with a third aspect of the invention, the film forming apparatus includes a filter installed in a transport path of the source gas extending from the source material vaporizing unit to an introduction portion of the film forming unit, wherein an outer peripheral portion of the filter is formed of an annular outer peripheral member. The outer peripheral member is airtightly connected to an outer peripheral part of a filter material disposed inside the outer peripheral portion, and the outer peripheral member is configured not to be deformed more easily than the filter material by a load imposed in a pressing direction, and is fixed to an inner surface of the transport path.

In accordance with the first to the third aspects of the present invention, the outer peripheral member can be fixed to the inner surface of the transport path by a uniform pressing force over the entire perimeter thereof, and a gap is prevented from being formed between the outer peripheral portion of the filter and the inner surface of the transport path. Thus, the source gas cannot flow through the boundary between the outer peripheral portion of the filter and the inner surface of the transport path, whereby particles or unvaporized source material is prevented from leaking to the downstream side of the filter through the gap.

It is preferable that a heat transfer member for heating the filter is in contact with an inner part of the outer peripheral portion. In this configuration, since heat is transferred by the heat transfer member to the inner part of the filter as well, a temperature drop of the inner part of the filter due to a flow of the source gas, a vaporization of the unvaporized source material or the like can be reduced, and thus a clogging of the filter can be suppressed to thereby lessening the maintenance work.

It is preferable that the transport path of the source gas has an ascending line portion extended vertically or obliquely upward toward the film forming unit. By the ascending line portion extending vertically or obliquely upward toward the film forming unit disposed at the transport path of the source gas, the movement of the particles in the transport path to the film forming unit is suppressed, so that the amount of particles introduced into the film forming unit can be reduced.

It is preferable that the ascending line portion is installed between the film forming unit and a gas inlet valve that permits and stops a supply of the source gas to the film forming unit. If the ascending line portion is installed at an upstream side of the transport path of the source gas, the movement of particles generated in the transport path at the downstream side of the ascending line portion cannot be suppressed. However, by installing the ascending line portion at a location in the transport path that is closest to the film forming unit as described above, the movement of particles generated in most parts of the transport path can be suppressed. Therefore, the number of particles in the film forming unit can be further reduced.

It is preferable that a gas inlet valve that permits and stops the supply of the source gas to the film forming unit is installed in the transport path, and a purge line for introducing a purge gas is connected to the gas inlet valve or to a location at a side of the film forming unit near the gas inlet valve. With this configuration, it is possible to eliminate or reduce the stagnation space (the space in the pipe between the gas inlet valve and the film forming unit) in which the source gas stagnates while the gas inlet valve is closed. Therefore, the source gas does not stagnate in the pipe, or the stagnating source gas can be promptly and sufficiently diluted or replaced with the purge gas, whereby particle generation due to the stagnating source gas in the pipe can be prevented.

It is preferable that the film forming unit has a shield member made of metal installed around a mounting member having a film forming area for mounting thereon a substrate is to be mounted. Thus, by providing the metal shield member around the mounting member (a suseptor or an electrostatic chuck susceptor) in the film forming unit, the heat conductivity of the shield member is improved, so that deposits attached to the shield member is rarely peeled off therefrom. Therefore, the particle generation in the film forming unit can be suppressed.

It is preferable that the film forming unit has a mounting member having a film forming area for mounting thereon a substrate, and a plurality of positioning projections for positioning the substrate is formed around the film forming area discretely. Thus, by arranging the plurality of positioning projections for positioning the substrate around the film forming area in the discrete manner, stagnation of the gas flowing from above the substrate toward the periphery of the mounting member can be suppressed. Therefore, the amount of deposits around the film forming area can be reduced, and the particle generation in the film forming unit can be suppressed.

It is preferable that a region of the mounting member from the film forming area to an outside of the positioning projections is made of a same material and formed as a single body, and is not covered with other parts. With this configuration, a temperature variation around the substrate and stagnation of gas are reduced, and a radial gas flow is rarely hampered. Further, a less amount of deposits are formed uniformly, and the deposits are not easily peeled off, thereby further reducing the particle generation. Herein, it is preferable that the area of the mounting member formed as the single body of the same material and not covered with other parts extends to a position outwardly away from the positioning projections by a distance equal to or greater than 30% of a radius of the film forming area. Further, it is more preferable that the above-mentioned area extends to a position outwardly away from the positioning projections by a distance equal to or greater than 45% of the radius of the film forming area.

In the film forming apparatus, it is preferable that a gas inlet valve is installed between the source material vaporizing unit and the film forming unit, and the gas inlet valve at least has a diaphragm valve for controlling a supply of the source gas to the film forming unit, wherein the diaphragm valve has an inlet and an outlet opening opened to a valve chamber at which the diaphragm is located, and the opened area of the inlet opening is approximately same as that of the outlet opening.

In the film forming apparatus, it is preferable that a gas inlet valve is installed between the source material vaporizing unit and the film forming unit, the gas inlet valve at least has a diaphragm valve for controlling a supply of the source gas to the film forming unit, the diaphragm valve has an inlet and an outlet opening opened to a valve chamber at which the diaphragm is located, one of the openings is formed at a center of the valve chamber, and the other of the openings is formed at a periphery of the valve chamber, wherein the other of the openings has a shape elongated in a direction circling around the center of the valve chamber, or the other of the openings is formed of plural openings arranged in the direction circling around the center of the valve chamber Further, in accordance with a fourth aspect of the present invention, there is provided a vaporizer including a vaporizing vessel having a source material vaporizing space therein; an atomizing unit for vaporizing a source material of liquid or gas-liquid mixture into the source material vaporizing space, a source gas discharge unit combined with the vaporizing vessel as a single body such that an inner surface thereof faces the source material vaporizing space, source material discharge unit having a source gas discharge opening for discharging the source material vaporized in the vaporizing vessel out of the vaporizing vessel; a first heating member for heating the vaporizing vessel; a second heating member for heating the source gas discharge unit; a filter attached to the source gas discharge unit to cover the source gas discharge opening; an annular supporting member that presses an outer peripheral portion of the filter against the inner surface of the source gas discharge unit such that the outer peripheral portion of the filter is in close contact with the inner surface of the source gas discharge unit; a heat transfer member, protruding from the inner surface of the source gas discharge unit to contact a part of the filter inside the outer peripheral portion, for transferring heat generated by the second heating portion to the filter; and a shielding plate arranged to cover the filter when viewed from the source material vaporizing space with a gap between the shielding plate and the filter such that a source gas is allowed to be introduced into the filter from the source material vaporizing space by bypassing the shielding plate, the shielding plate being thermally connected to the heat transfer member. The supporting member is configured not to be deformed more easily than the outer peripheral portion by a load imposed in a pressing direction, and is pressed over an entire perimeter thereof against the inner surface of the source gas discharge unit, so that the outer peripheral portion is fixed to the inner surface of the transport path while being compressed between the inner surface of the source gas discharge unit and the supporting member.

In accordance with the fourth aspect of the present invention, advantageous effects can be achieved in that the number of particles in the film forming unit can be remarkably reduced, and a deposited film quality can be enhanced.

DETAILED DESCRIPTION OF EMBODIMENTS

Hereinafter, embodiments of the present invention will be described with reference to the accompanying drawings.

(Overall Configuration of a Film Forming Apparatus)

Figure 1:
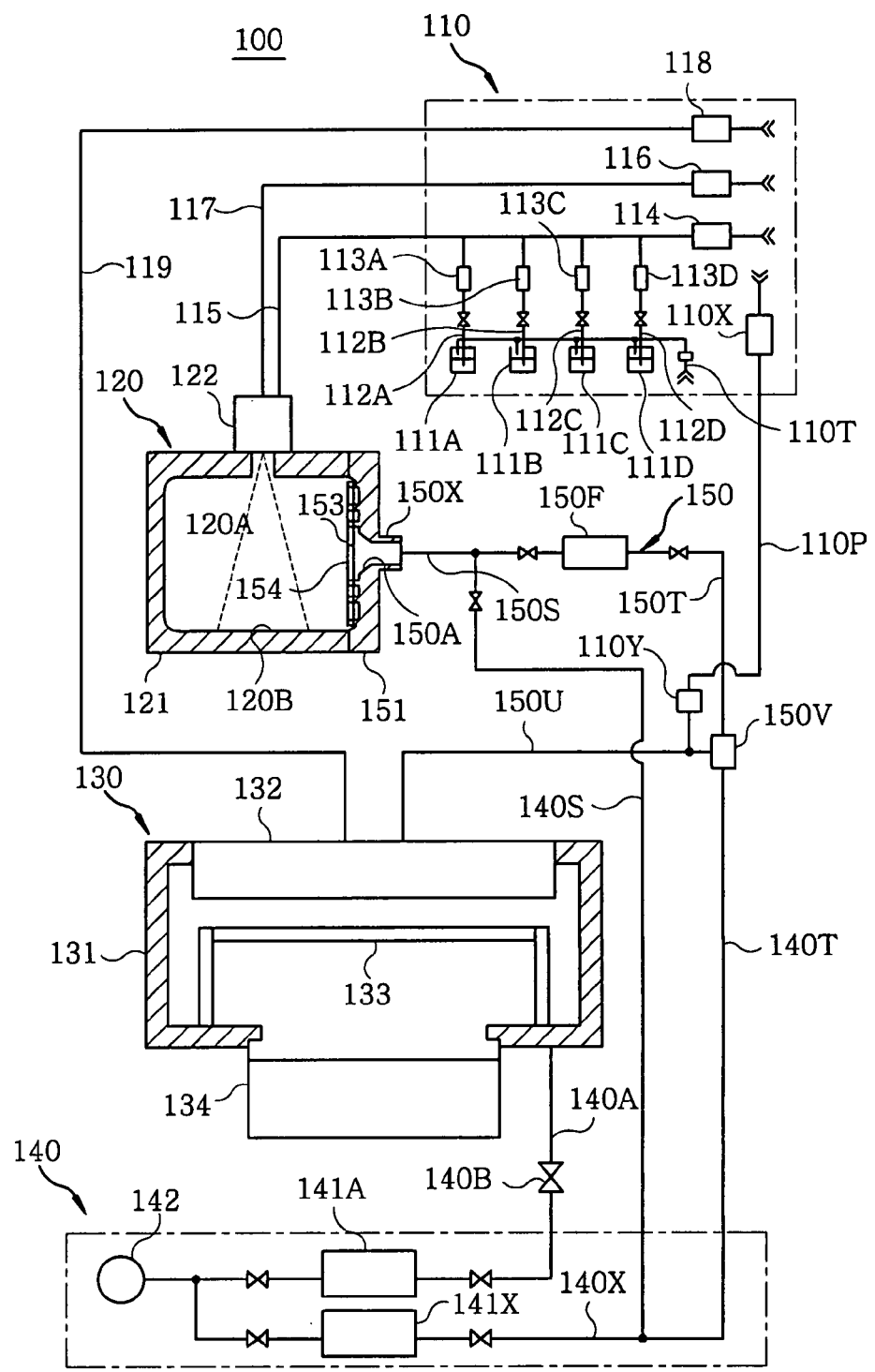
FIG. 1 is a schematic configuration view showing an overall configuration of a film forming apparatus in accordance with a first embodiment of the present invention.

FIG. 1 is a schematic view showing an overall configuration of a film forming apparatus in accordance with an embodiment of the present invention. The film forming apparatus 100 includes source material supply unit 110; source material vaporizing unit 120 for vaporizing source material supplied from the source material supply unit 110; a film forming unit 130 for performing a film formation by using a source gas generated by the source material vaporizing unit 120; an gas exhaust unit 140 for evacuating the film forming unit 130; a transport path 150 for transporting the source gas generated by the source material vaporizing unit 120 into the film forming unit 130.

The source material supply unit 110 has a plurality of chambers 111A to 111D; individual supply lines 112A to 112D respectively connected to the plurality of chambers; mass flow controllers 113A to 113D respectively installed on the individual supply lines; a mass flow controller 114 connected with a carrier gas source for supplying a non-reactive gas such as Ar; source material supply line 115 connected to the mass flow controller 114, wherein the individual supply lines 112A to 112D are coupled to the source supply line 115. Each of the plurality of chambers 111A to 111D accommodates therein a solvent, a liquid source material, or the like, and the solvents or the liquid source materials are sent into the respective supply lines 112A to 112D by, e.g., a pressuring operation of a force feed gas line 110T (a line for supplying a non-reactive gas such as He into the receptacles). Then, the solvents or the liquid source materials are pressed out into the source supply line 115, while their flow rates are controlled by the mass flow controllers 113A to 113D.

For example, in case of forming a ferroelectric thin film of PZT ($Pb[Z_{r1-x}Ti_x]O_3$) having a perovskite crystal structure, a liquid organometallic compound is used. For instance, an organic solvent such as butyl acetate is accommodated in the chamber 111A; an organic Pb source material such as $Pb(DPM)_2$ is accommodated in the chamber 111B; an organic Zr source material such as $Zr(O-t-Bu)_4$ is accommodated in the chamber 111C; and an organic Ti source material such as $Ti(O-i-Pr)_4$ is accommodated in the chamber 111D. The PZT thin film is formed by a reaction of a source gas generated from any of the above-specified source materials with an oxidizing agent such as a reactant gas, e.g., $NO_2$, to be described later. Other than the PZT thin film, BST ($(Ba,Si)TiO_3$), BTO ($BaTiO_3$), PZTN ($Pb(Zr,Ti)Nb_2O_8$), SBT ($SrBi_2Ta_2O_9$), STO ($SrTiO_3$), BTO ($Bi_4Ti_3O_{12}$), and so forth can be exemplified as ferroelectric thin films to be formed by the film forming apparatus of the present invention.

Also, the source material supply unit 110 further includes a mass flow controller 116 for use in supplying a atomizing gas such as a non-reactive gas of, e.g., Ar; an atomizing gas supply line 117; a mass flow controller 118 for use in supplying an oxidizing reactant gas such as $O_2$, $O_3$, $NO_2$, NO, $N_2O$, or the like; and a reactant gas supply line 119. Further, though the above atomizing gas supply system and the reactant gas supply system are shown to be included in the source material supply unit 110 in the shown example, they can be provided independently of the source material supply unit 110.

The source material vaporizing unit 120 includes a vaporizing vessel 121; and a atomizing nozzle 122 connected to the source material supply line 115 and the atomizing gas supply line 117, wherein the atomizing nozzle 122 is opened to a source material vaporizing space 120A provided inside of the vaporizing vessel 121 to spray mists of the source material by using the non-reactive gas such as an Ar gas as an auxiliary atomizing gas. Here, though the source material supply line 115 of the source material supply unit 110 is configured such that it transfers a liquid source material along with a carrier gas to supply the source material in a gas-liquid mixed state into the source material vaporizing unit 120, it is also possible to configure the source material supply line 115 to transfer only the liquid source material in it.

In the source material vaporizing space 120A of the source material vaporizing unit 120, the mists sprayed from the atomizing nozzle 122 are vaporized by being heated by a vaporizing surface 120B either directly or indirectly, and as a result, a source gas is generated. The source gas is introduced into an inner space 150A formed by a shielding plate 154 and a partition wall 151 of a source gas discharge unit 150X and then introduced into a source gas transporting line 150S through a source gas discharge opening after passing through a filter 153. The source gas transporting line 150S is connected with a source gas transporting line 150T. Here, a line filter 150F is interposed between the source gas transporting lines 150S and 150F.

However, the line filter 150F need not necessarily be provided, as will be described later. The source gas transporting line 150T is coupled to a source gas transporting line 150U via a gas inlet valve 150V, and the source gas transporting line 150U is led to the film forming unit 130. The source gas discharge unit 150X, the source gas transporting line 150S, (the line filter (150F)), the source gas transporting line 150T, the gas inlet valve 150V and the source gas transporting line 150U together form a source gas transport path.

Also, a bypass line 140T, the transport path 150, the source gas transporting lines 150S and 150U, a bypass line 140S, a gas exhaust line 140X, the gas inlet valve 150V, a gas exhaust line 140A, a pressure control valve 140B are heated by a heater (not shown). Further, partition walls forming the film forming vessel 131 are also heated.

Moreover, as shown in FIG. 1, there is also provided in the source material supply unit 110 a purge line 110P for discharging a non-reactive gas such as an Ar gas or other purge gas, wherein flow rate thereof is controlled by means of a mass flow controller 110X. The purge line 110P is connected to the source gas transport path via a purge valve 110Y. Conventionally, the purge line has been typically connected to the source gas transport path at a position near the film forming unit 130 or connected to a gas inlet unit 132 of the film forming unit 130. However, in this embodiment, the purge line 110P is coupled to the source gas transport path at a position near the gas inlet valve 150V. More specifically, in the example shown in FIG. 1, the purge line 110P is coupled to the source gas transporting line 150U at a position near the gas inlet valve 150V.

The bypass line 140S is coupled to the source gas transporting line 150S, and the bypass line 140S is connected to a gas exhaust line 140X to be described later. Also, the gas inlet valve 150V is connected to the bypass line 140T, and the bypass line 140T is coupled to the gas exhaust line 140X to be descried later.

The film forming unit 130 includes the film forming vessel 131 that can be airtightly sealed; the gas inlet unit 132 for introducing a gas into the film forming vessel 131; a susceptor 133 for mounting thereon a substrate on which a film is to be formed; and a heating unit 134 formed of, e.g., a heating lamp, for heating the susceptor 133. The source gas transporting line 150U and the reactant gas supply line 119 are led to the gas inlet unit 132, and the gas inlet unit 132 serves to have the source gas and the reactant gas flow toward the substrate loaded on the susceptor 133. In this embodiment, the gas inlet unit 132 has a shower head structure provided with a number of source gas inlet openings and reactant gas inlet openings installed to face a substrate mounting surface of the susceptor 133.

Further, the gas exhaust line 140A is coupled to the film forming vessel 131, wherein the gas exhaust line 140A is connected to a gas exhaust trap 141A and a vacuum pump 142 such as a dry pump via the pressure control valve 140B. Moreover, the gas exhaust line 140X to which the bypass lines 140S and 140T are connected is coupled to the vacuum pump 142 via a gas exhaust trap 141X. Also, the gas exhaust unit 140 includes the gas exhaust line 140A, the pressure control valve 140B, the gas exhaust trap 141A, the vacuum pump 142, the bypass lines 140S and 140T, the gas exhaust line 140X and the gas exhaust trap 141X.

The inside of the film forming vessel 131 of the film forming unit 130 is depressurized to a preset pressure level by the gas exhaust unit 140, wherein the pressure level is controlled by the pressure control valve 140B. In this depressurized state, the source gas and the reactant gas introduced from the gas inlet unit 132 react with each other, whereby a thin film is formed on the substrate mounted on the susceptor 133. Further, in this embodiment, though the film forming apparatus 110 is configured as a thermal CVD apparatus, it can be configured as a plasma CVD apparatus instead. In such a case, the film forming unit 130 is provided with a plasma generating unit such as a high frequency power supply or a matching circuit.

First Embodiment

Figure 2:
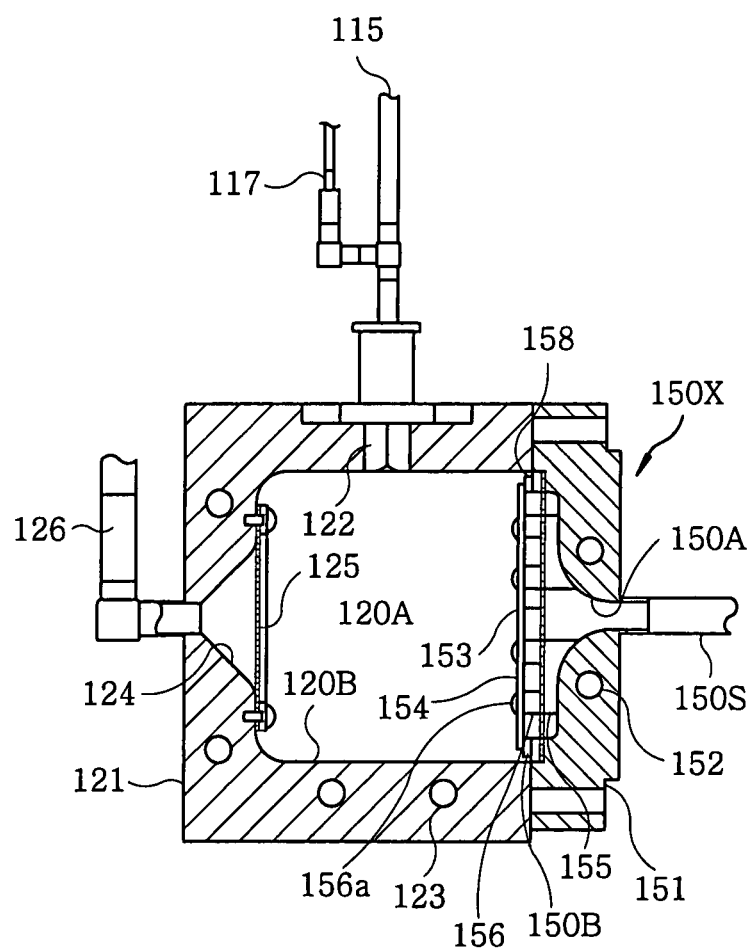
FIG. 2 sets forth a vertical cross sectional view of a source material vaporizing unit.

Detailed Configuration of the Source Material Vaporizing Unit and the Source Gas Transport Path Referring to FIG. 2, there is provided a vertical cross sectional view showing a detailed configuration of the source material vaporizing unit 120. The source material vaporizing unit 120 includes a heating unit 123 such as a heater installed inside of partition walls of the vaporizing vessel 121 enclosing the source material vaporizing space 120A. The vaporizing surface 120B is heated by the heating unit 123, and the vaporizing space 120A is also heated by radiant heat from the vaporizing surface 120B. The vaporizing vessel 121 is provided with an opening 124, and a filter 125 is disposed between the opening 124 and the source material vaporizing space 120A. However, in a configuration where a filter is installed at a place in the source material transport path, the filter 125 can be omitted. Further, the opening 124 is connected with a pressure detection line 126 led to a pressure gauge (capacitance monometer) (not shown) for detecting the internal pressure of source material vaporizing space 120A.

The source gas discharge unit 150X forms the most upstream portion of the "source gas transport path" and serves to discharge a source gas generated in the source material vaporizing space 120A into the source gas transporting line 150S. The source gas discharge unit 150X has an inner space 150A formed by a recessed portion provided at an inner surface of the partition wall 151 on a side of the source material vaporizing space 120A, and the source material vaporizing space 120A is allowed to communicate with the source gas transporting line 150S via the inner space 150A.

Further, the heating unit 152 such as a heater is disposed inside (within a hole 151a in FIG. 3A) of the partition wall 151 to heat the inner space 150A. In addition, the above-mentioned filter 153 and the shielding plate 154 are installed in the inner space 150A, and the inner surface of the partition wall 151 is provided with columnar heat transfer protrusion portions that protrude into the inner space 150A to be in direct contact with the filter 153.

Here, the filter 153 disposed in the inner space 150A can be formed of a filter material having air permeability and particle trapping capability. For example, a porous material, a material having a number of pores, a material obtained by compressing and hardening (by sintering), e.g., a fiber, a wire or strip material, a mesh shaped material, or the like can be used as the material for the filter 153. More specifically, a filter material obtained by compression-molding ultra-thin metal fiber or metal wire material (made up of, e.g., stainless steel) having durability against high temperature (ranging from, e.g., 180 to 350° C., though the temperature can be appropriately set depending on a vaporization temperature or a decomposition temperature of the source material).

Here, the diameter of the metal fiber may preferably range from 0.01 to 3.0 mm. Further, a sintered material obtained by sintering a ball-shaped or granular material having a high thermal conductivity can be employed instead of the fiber, the wire material, the strip material or the like. These various filter materials can be formed of a non-metal material such as ceramic, quartz, and the like; a stainless steel; a non-ferrous metal such as aluminum, titanium, and nickel; and an alloy thereof.

Figure 3A:
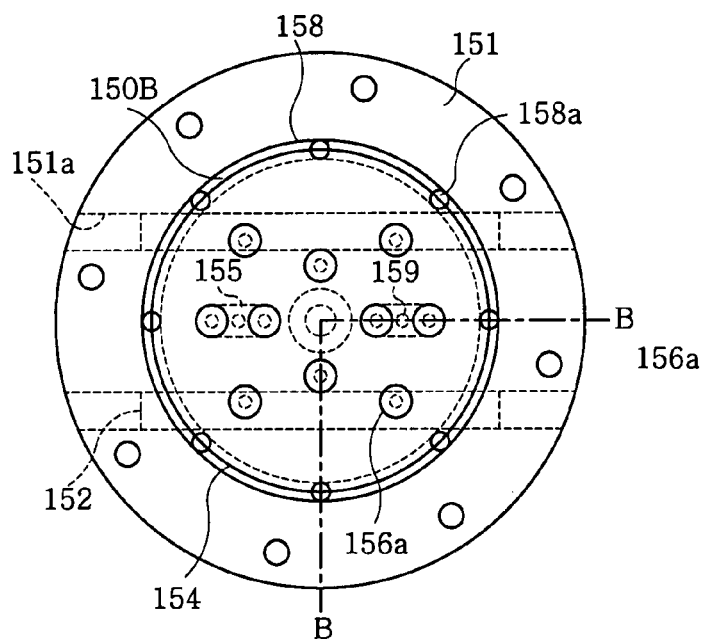
FIGS. 3A and 3B present an interior view and a vertical cross sectional view of a gas discharge unit, respectively.
Figure 3B:
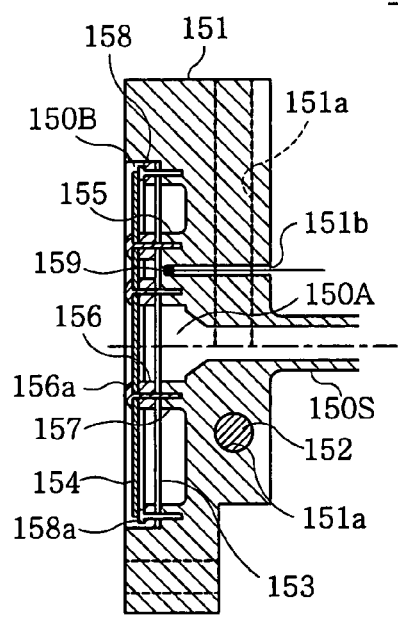
Figure 4:
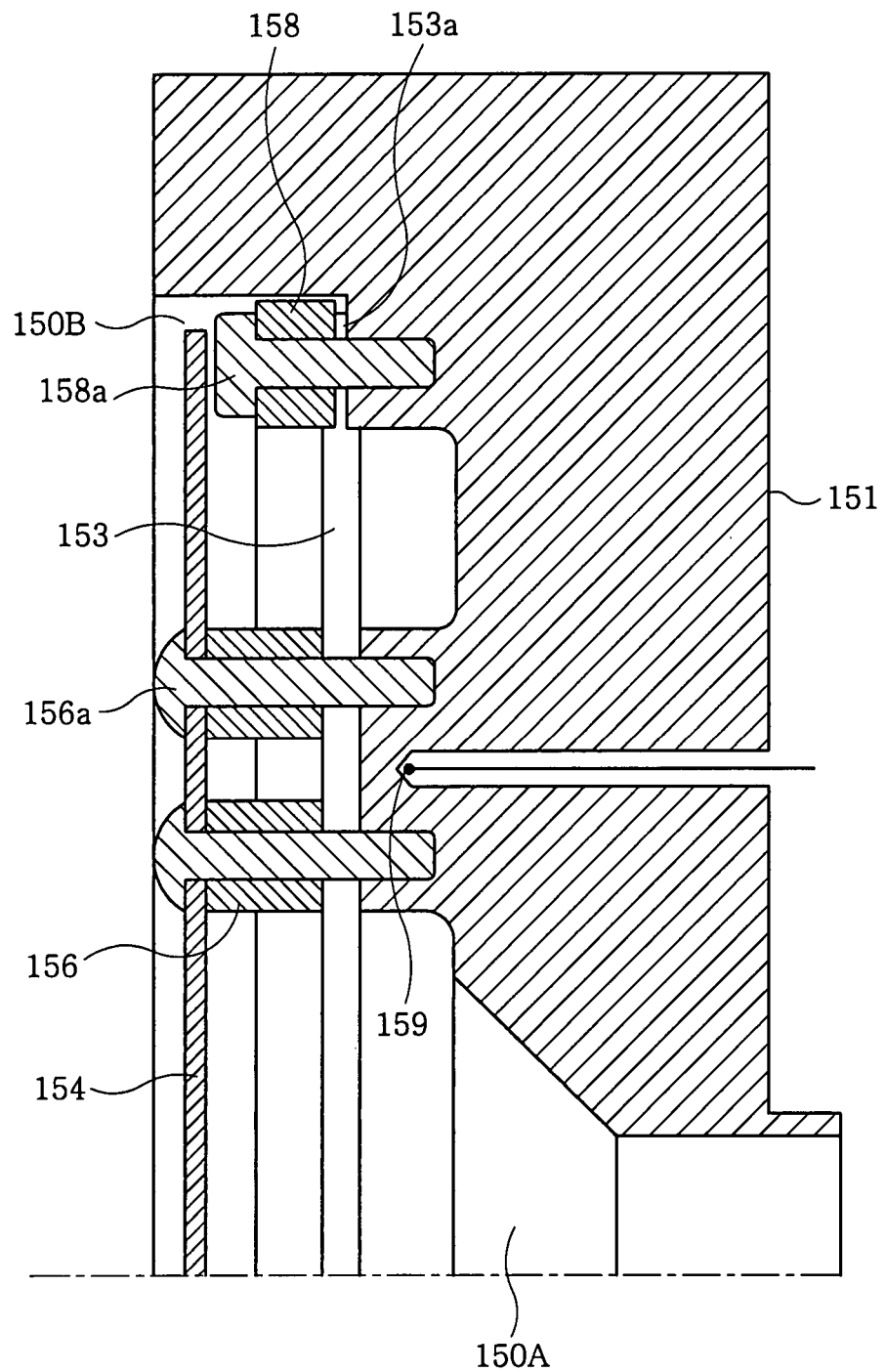
FIG. 4 provides an enlarged partial cross sectional view of the gas discharge unit.

FIG. 3A sets forth a side view of the inner surface of the source gas discharge unit 150X viewed from the side of the source material vaporizing space 120A, and FIG. 3B provides a vertical cross sectional view taken along a line B-B of FIG. 3A. Further, FIG. 4 presents an enlarged partial cross sectional view of a part of the cross section shown in FIG. 3B. The filter 153 is disposed to cover an entire flow path cross section, and the outer peripheral portion of the filter is in contact with and fixed at the inner surface of the partition wall 151. To be more specific, the outer peripheral portion of the filter 153 tightly contact to the inner surface of the partition wall 151 by clamping fastening screws 158a via an annular supporting member 158.

That is, as shown in FIG. 4, by screwing the fastening screws 158a into the partition wall 151 through the supporting member 158 and the outer peripheral portion 153a of the filter 153, the supporting member 158 is made to press the outer peripheral portion 153a of the filter 153 against the inner surface of the partition wall 151 by axial forces of the fastening screws 158a. In the example shown therein, the supporting member 158 is a flat ring shaped member, so that it can press the outer peripheral portion of the filter 153 along its entire circumference. Meanwhile, the outer peripheral portion 153a of the filter 153 is formed of the above-cited filter material just like the other portions of the filter 153 inside it. That is, the entire part of the filter 153 including the outer peripheral portion 153a is formed as a single body made up of a single uniform filter material.

The supporting member 158 is formed of, e.g., stainless steel. The supporting member 158 is configured such that it is more hardly deformed by a load imposed in the pressing direction (i.e., it is configured to have a higher stiffness against the load imposed in the pressing direction) compared to the outer peripheral portion 153a of the filter 153. Though the supporting member 158 gets local pressures applied thereto at positions near the plurality of fastening screws 158a arranged at an interval in the circumferential direction due to the axial forces of the fastening screws 158a.

Since, however, the supporting member 158 has a sufficiently high stiffness, it is hardly bent (hardly deformed in the pressing direction) by the local pressures, and the supporting member 158's surface contacting the outer peripheral portion 153a of the filter 153 can be maintained to be flat, thus pressing the outer peripheral portion 153a of the filter 153 evenly in the circumferential direction. Further, since the supporting member 158 has a uniform structure (except for holes where screws are inserted to be described later) in its circumferential direction, it can press the outer peripheral portion of the filter 153 more evenly.

Specifically, the supporting member 158 has a same cross sectional shape in all its circumferential direction and is formed of a single uniform material. In addition, though the supporting member 158 is formed of stainless steel like the filter 153, the material of the supporting member 158 has higher density and stiffness than that of the filter 153 that is formed to have air permeability (or is formed of a porous material or a material obtained by compressing and hardening a strip or granular material).

Moreover, the supporting member 158 is formed to be internally solid and uniform in its circumferential direction, whereby the supporting member 158 can press the outer peripheral portion 153a evenly in the circumferential direction. Further, as shown in FIG. 4, the supporting member 158 is preferably formed to be thicker than the outer peripheral portion 153a of the filter (preferably, at least twice the thickness of the outer peripheral portion 153a). With this configuration, a higher stiffness of the supporting member 158 can be obtained, and the supporting member 158 can press the outer peripheral portion 153a evenly in its circumferential direction.

In the present embodiment, the outer peripheral portion 153a of the filter 153 is in a compressed state between the supporting member 158 and the partition wall 151. That is, by fastening the fastening screws 158a, the outer peripheral portion 153a of the filter 153 is fixed at the inner surface of the partition wall 151 by being pressed by the supporting member 158 which has higher stiffness and is structured uniformly in the circumferential direction, whereby the outer peripheral portion 153a of the filter 153 is maintained compressed over its entire perimeter.

As shown in FIG. 3, heat transfer members 155 and 157 protruding inwardly from the partition wall 151 are in direct contact with the remaining part of the filter 153 other than the outer peripheral portion 153a (here, simply referred to as "inner portion"). Each of the heat transfer members 155 and 157 is formed as a single body with the partition wall 151, and has a columnar shape protruding inwardly from the inner surface of the partition wall 151. In this configuration, the inner portion of the filter 153 is in thermal contact with the partition wall 151 via the heat transfer members 155 and 157. Accordingly, the filter 153 receives heat not only at its outer peripheral portion 153a but also at parts of the inner portion that contact the heat transfer members 155 and 157. Further, the heat transfer members 155 and 157 also serve as supporting members for supporting the inner portion of the filter 153.

Each of the heat transfer members 155 and 157 is made up of a metal having a high thermal conductivity (e.g., stainless steel, nickel, copper, chrome, aluminum or an alloy thereof). The heat transfer member 155 is formed to have a columnar shape with an elliptical horizontal cross section, whereas the heat transfer member 157 is formed to have a columnar shape with a circular horizontal cross section. Further, in this example, though the heat transfer members 155 and 157 are indirectly heated by the heating unit 152 such as a heater disposed within the partition wall 151, the heat transfer members themselves can be configured as heating devices or heating devices can be embedded within the heat transfer members.

Moreover, the shielding plate 154 is disposed adjacent to a side of the filter 153 facing the source material vaporizing space 120A. The shielding plate 154 is made up of a thermally conductive material (metal material) such as stainless steel. The shielding plate 154 faces the source material vaporizing space 120A, and covers the filter 153 to hide it when viewed from the source material vaporizing space 120A. Further, provided between the shielding plate 154 (specifically, its outer peripheral portion) and the inner surface of the partition wall 151 is a communication hole 150B which allows the source material vaporizing space 120A to communicate with the inner space 150A.

Together with the filter 153, the shielding plate 154 is fixed at the heat transfer member 155 via a spacer 156. The spacer 156 is made up of a highly heat conductive material, e.g., a metal such as Al and stainless steel, ceramics, and so forth. Further, the fastening screws 156a are means for fixing the shielding plate 154 and the spacer 156 at the heat transfer member 155, and similar fixing means are used for the fixation of the filter 153 to the heat transfer member 157. Though the filter 153 and the shielding plate 154 are mainly heated by conductive heat transferred from the heating unit 152 via the heat transfer member 155 and the spacer 156, they are also heated by radiant heat radiated from the vaporizing surface 120B facing the source material vaporizing space 120A.

In the present embodiment, a detection point of a temperature sensor (e.g., a thermocouple) 159, which is inserted into a hole 151b provided in the partition wall 151, is positioned in the heat transfer member 155 having an extended planer shape. With this configuration, the temperature of the heat transfer member, which is very close to the temperature of the filter 153, can be detected. An output of the temperature sensor 159 is connected to a temperature control circuit (not shown) which is set up to control the heating unit 152 based on an output of the temperature sensor 159. As described, since the heating unit 152 can be controlled by detecting the temperature of the heat transfer member 155 in this embodiment, the temperature of the shielding plate 154 can be controlled more efficiently, whereby a temperature drop of the shielding plate 154 can be reduced. In this case, a set temperature of the heating unit 152 is preferably equal to a set temperature of the vaporizing surface 120B.

In the present embodiment, the source material supplied from the source material supply line 115 is atomized into the source material vaporizing space 120A via the atomizing nozzle 122. A part of the mist of the sprayed source material is vaporized before reaching the vaporizing surface 120B, whereas the remaining part of the mist reaches the vaporizing surface 120B heated by the heating unit 123 and is heated thereat to be vaporized. To vaporize the source material, the vaporizing surface 120B is heated by the heating unit 123 within a temperature range higher than a vaporization temperature but lower than a decomposition temperature of the source material, e.g., within a range from about 100 to 350° C.

A source gas generated in the source material vaporizing space 120A by the vaporization of the source material is introduced into the inner space 150A through the communication hole 150B by going around the shielding plate 154. Then, the source gas introduced into the inner space 150A is directed into the source gas transporting line 150S after passing through the filter 153. Here, though the source gas being introduced into the inner space 150A contains fine residual mist that is not yet vaporized in the source material vaporizing space 120A, the residual mist is trapped by the filter 153 and also vaporized by heat transferred from the heating unit 152 to the filter 153 via the heat transfer members 155 and 157. Preferably, the filter 153 is heated within a temperature range substantially equal to the temperature range of the vaporizing surface 120B.

In the present embodiment, since the entire circumference of the outer peripheral portion 153a of the filter 153 is fixed on the inner surface of the partition wall by being pressed by the supporting member 158 having a higher stiffness, the pressure from the supporting member 158 is evenly applied to the outer peripheral portion 153a of the filter 153 over the entire perimeter thereof. Further, since there is the difference between thermal expansion rates of the partition wall 151 and the outer peripheral portion 153a of the filter 153, respective amounts of thermal expansion are different from one another when they are heated by the heating unit 152 and so forth.

Since, however, the outer peripheral portion 153a of the filter 153 is compressed between the supporting member 158 and the inner surface of the partition wall 151, the difference between the thermal expansion rates of the partition wall 151 and the filter 153 hardly influences the tight contact therebetween. Thus, gaps between the outer peripheral portion 153a of the filter 153 and the inner surface of the partition wall 151 are seldom formed. Accordingly, the source gas or the residual mist can be prevented from leaking into the downstream side through such gaps.

In particular, since the filter 153 gets heated not only at its outer peripheral portion 153a but also at the parts of the inner portion that contact the heat transfer members 155 and 157, a temperature drop of the inner portion can be reduced, and thus the vaporizing efficiency can be enhanced. Thus, the inner portion of the filter 153 can be prevented from being locally clogged up. Further, it is preferable that the heat transfer members 155 and 157 are arranged to evenly cover the entire part of the filter 153 in the flow path cross section of the source gas. With this configuration, it is possible to heat the filter 153 more evenly and improve the efficiency of vaporizing the residual mist, while further reducing the clogging of the filter.

Meanwhile, the shielding plate 154 prevents the mist sprayed from the atomizing nozzle 122 from directly reaching the filter 153. Thus, the filter 153 can be prevented from being deprived of heat by a large quantity of mist and thus suffering a partial degradation in its capability for vaporizing the attached mist at some locations thereof. Therefore, the clogging of the filter at the specified locations can be suppressed, which in turn prevents a decrease in the discharged amount of the source gas due to the clogging.

Moreover, since the shielding plate 154 is heated by the heat transferred thereto via the heat transfer members 155 and 157, vaporization of the mist is also carried out on the surface of the shield plate 154 when the mist of the source material directly contacts the shielding plate 154. As described, in accordance with the first embodiment, the source gas discharge unit 150X can perform a function of vaporizing the mist of the source material, so that the overall vaporizing efficiency can be improved.

In the first embodiment described above, the source gas discharge unit 150X is configured such that the filter 153 can be simply taken out of the apparatus by separating the partition wall 151 from the partition wall 121. Accordingly, when there occurs a problem such as clogging of the filter 153 and the like, it is possible to separate and clean the filter 153 or replace it with a new one promptly. Thus, time required for the maintenance work can be reduced, and the operating rate of the apparatus and the yield can be improved.

EXAMPLES OF MODIFIED CONFIGURATION

Now, there will be described modifications of the attachment mechanism for fixing the outer peripheral portion 153$a$ of the filter 153 to the inner surface of the partition wall 151. All of the modified examples to be described hereinafter can be employed instead of the above-described attachment mechanism in accordance with the first embodiment.

Figure 5:
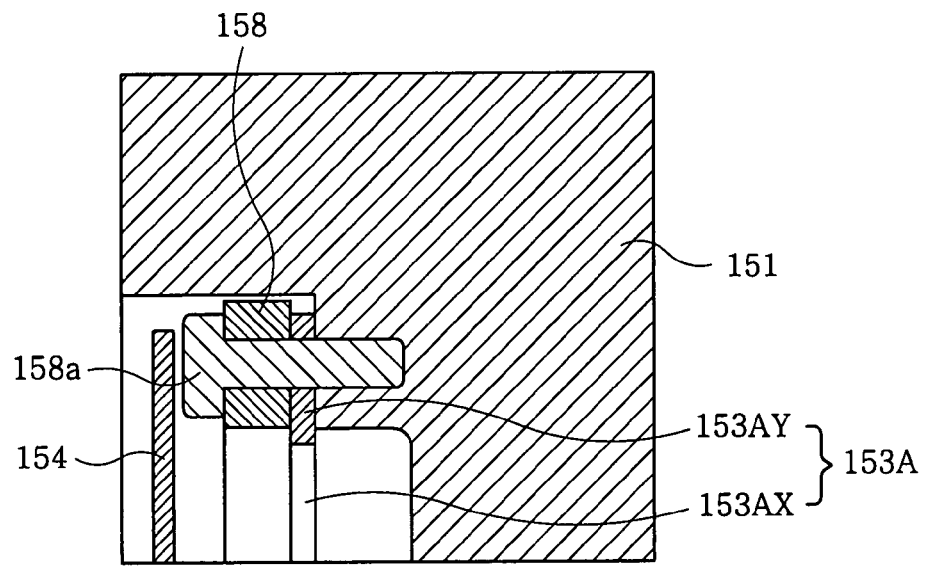
FIG. 5 offers an enlarged partial cross sectional view showing an example of modified configuration of the gas discharge unit.

In a modified example shown in FIG. 5, a filter 153A includes an inner portion 153AX made up of a filter material having air permeability to allow a source gas to pass therethrough; and an outer peripheral member 153AY airtightly connected to the inner portion 153AX by welding, thermal bonding, press-connecting or the like without any gap therebetween. Further, the other configurations except for the filter 153A are identical with those described above. Here, the inner portion 153AX is made up of the same filter material as described above, and the outer peripheral member 153AY is formed of a filter material, e.g., such a material as a solid metal which does not have air permeability, different from the filter material of the inner portion 153AX.

The outer peripheral member 153AY has a lower stiffness (tends to be deformed more easily than the supporting member) than that of a supporting member 158 against a load applied thereto in a pressing direction. For example, in case the outer peripheral member 153AY is made up of the same metal as used to form the supporting member 158, the outer peripheral member 153AY is formed as a plate-shaped member thinner than the supporting member 158. Over its entire perimeter, the outer peripheral member 153AY of the filter 153A is fixed and tightly contacts the inner surface of a partition wall 151 by being pressed by the supporting member 158. Here, in order to allow the outer peripheral member 153AY to be more tightly contact the partition wall 151, the contacting surfaces of the outer peripheral member 153AY and the partition wall 151 are smoothed by, e.g., a polishing process so that the surface roughness is reduced. It is especially preferable to increase the flatness of both surfaces.

Further, in the above configuration, in case the outer peripheral member 153AY and the supporting member 158 are configured to have a same stiffness, it is possible to omit the supporting member 158 and to fix only the outer peripheral member 153AY to the inner surface of the partition 151 by being pressed by fastening screws 158$a$. In such a case, since the supporting member 158 is omitted, the number of components required for this configuration can be reduced, which leads to a reduction in costs. Here, the annular outer peripheral member 153AY is airtightly connected to the outer peripheral portion of the inner filter member 153AX, and it has a higher stiffness than the inner filter member 153AX. Further, the outer peripheral member 153AY is formed to have a structure (cross sectional shape) uniform over its perimeter.

Figure 6:
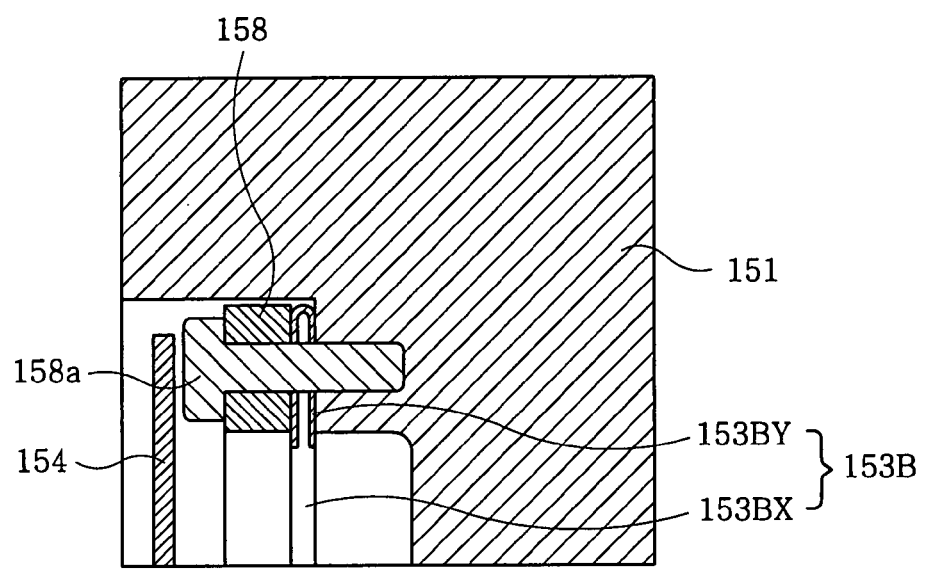
FIG. 6 presents an enlarged partial cross sectional view showing an example of modified configuration of the gas discharge unit.

In a modified example in FIG. 6, a filter 153B includes a filter material 153BX having air permeability and an outer peripheral member 153BY made up of a flexible plate-shaped member such as a metal thin plate which does not have air permeability. The outer peripheral member 153BY is bent and connected to the outer peripheral part of the filter material 153BX by welding, thermal bonding, press-connecting and the like such that the outer peripheral member 153BY allows the outer peripheral part of the filter material 153BX to be tightly fitted thereinto with no gap therebetween.

The outer peripheral portion of the filter 153B includes the outer peripheral member 153BY and the outer peripheral part of the filter material 153BX that is fitted into the outer peripheral member 153BY. The outer peripheral portion of the filter 153B is configured to have a lower stiffness than the supporting member 158 against the load applied thereto in the pressing direction and is in a compressed state between the supporting member 158 and the partition wall 151 by being pressed by the supporting member 158.

Figure 7:
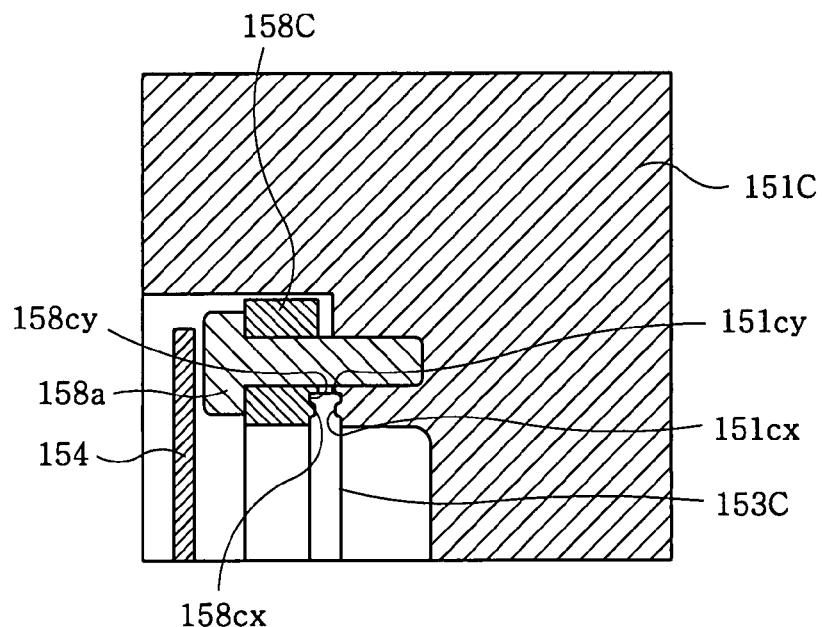
FIG. 7 illustrates an enlarged partial cross sectional view showing an example of modified configuration of the gas discharge unit.

In a modified example shown in FIG. 7, an outer peripheral portion of a filter 153C is inserted and compressed between a supporting member 158C and the inner surface of the partition wall 151C. A surface of a supporting member 158C in contact with the outer peripheral portion of the filter 153C has an uneven shape in a diametrical direction (vertical direction in the drawing) of the filter 153C, and is provided with an uneven surface structure 158$cx$ having a protrusion. The uneven surface structure 158$cx$ is formed on the inner surface of a groove portion 158$cy$ provided corresponding to the outer peripheral portion of the filter 153C.

Further, the uneven surface structure 158$cx$ of the supporting member 158C is in firm contact with the outer peripheral portion of the filter 153C, and the contacting surface of the filter 153C is formed to have an uneven shape in its diametrical direction. Moreover, the partition wall 151C's inner portion being in contact with the outer peripheral portion of the filter 153C also has an uneven shape in the diametrical direction of the filter 153C and is provided with an uneven surface structure 151$cx$ having a protrusion. The uneven surface structure 151$cx$ is formed on the inner surface of a groove portion 151$cy$ provided corresponding to the outer peripheral portion of the filter 153C.

The uneven surface structure 151$cx$ of the partition wall 151C is in firm contact with the outer peripheral portion of the filter 153C, and the contacting surface of the filter 153C is formed to have an uneven shape in its diametrical direction. In this example, the protrusion of the uneven surface structure 151$cx$ of the partition wall 151C and the protrusion of the uneven surface structure 158$cx$ of the supporting member 158 are provided at locations where they face each other via the outer peripheral portion of the filter 153C interposed therebetween. Since the outer peripheral portion of the filter 153C is kept strongly compressed by both protrusions, the airtightness between the outer peripheral portion of the filter 153C and the inner surface of the partition wall 151C can be further improved, and the contact therebetween can be more tightened.

Figure 8:
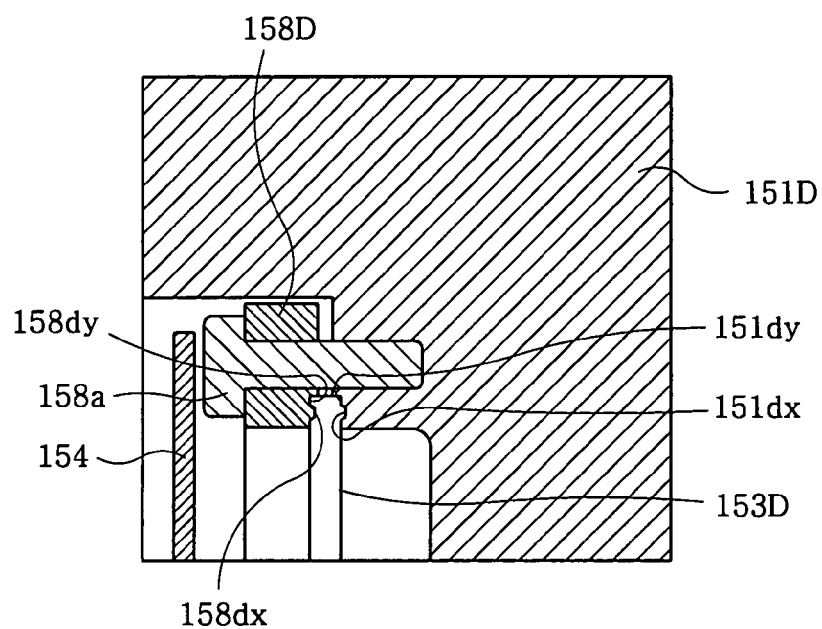
FIG. 8 depicts an enlarged partial cross sectional view showing an example of modified configuration of the gas discharge unit.

In a modified example shown in FIG. 8, as in the example illustrated in FIG. 7, a diametrical uneven surface structure 158$dx$ with a protrusion is formed on the surface of a supporting member 158D, and the uneven surface structure 158$dx$ is formed on the inner surface of a groove portion 158$dy$ provided corresponding to the outer peripheral portion of the filter 153D. Further, a diametrical uneven surface structure 151$dx$ having a recess is formed on the inner portion of the partition wall 151D. The uneven surface structure 151$dx$ is formed on the inner surface of a groove portion 151*dy* provided corresponding to the outer peripheral portion of the filter 153D.

This example is different from that shown in FIG. 7 in that the protrusion of the uneven surface structure 158*dx* of the supporting member 158D and the recess of the uneven surface structure 151*dx* of the partition wall 151D are provided at locations where they face the outer peripheral portion of the filter 153D interposed therebetween. Further, the recess of the uneven surface structure 158*dx* of the supporting member 158 and the protrusion of the uneven surface structure 151*dx* are provided at locations where they face each other via the outer peripheral portion of the filter 153D interposed therebetween. With this configuration, the outer peripheral portion of the filter 153D gets compressed and locally deformed toward the inner surface of the partition wall 151D, whereby the airtightness between the outer peripheral portion of the filter 153D and the inner surface of the partition wall 151D can be further improved, and the contact therebetween can be more tightened.

Figure 9:
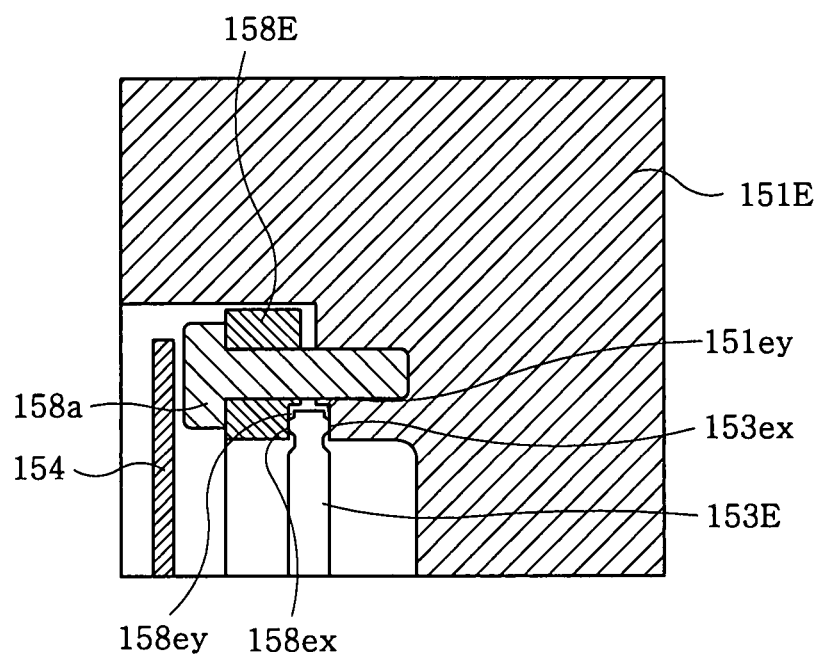
FIG. 9 is an enlarged partial cross sectional view showing an example of modified configuration of the gas discharge unit.

In a modified example shown in FIG. 9, a filter 153E has an uneven surface structure 153*ex* formed on the surfaces of its outer peripheral portion to have an uneven shape in a diametrical direction of the filter 153E. The uneven surface structure 153*ex* has protrusions formed at the outer peripheral portion of the filter 153E. In this example, the uneven surface structure 153*ex* has recesses in addition to the protrusions, wherein the recesses and the protrusions are formed on both of the front and the rear surface of the outer peripheral portion of the filter 153E. Meanwhile, a groove portion 151*ey* is formed at a part of the partition wall 151E corresponding to the outer peripheral portion of the filter 153E, and a groove portion 158*ey* is formed at a part of a supporting member 158E corresponding to the outer peripheral portion of the filter 153E. Here, by being press-fixed by the supporting member 158E, the uneven surface structures 153*ex* are brought into pressed contact with the inner surface of the groove portion 158*ey* of the supporting member 158E and the inner surface of the groove portion 151*ey* of the partition wall 151E, whereby the filter 153E's outer peripheral parts where the protrusions of the uneven surface structures 153*ex* are provided are kept in a strongly compressed state, so that the airtightness between the outer peripheral portion of the filter 153E and the inner surface of the partition all 151E can be improved, and the contact therebetween can be more tightened.

Figure 10A:
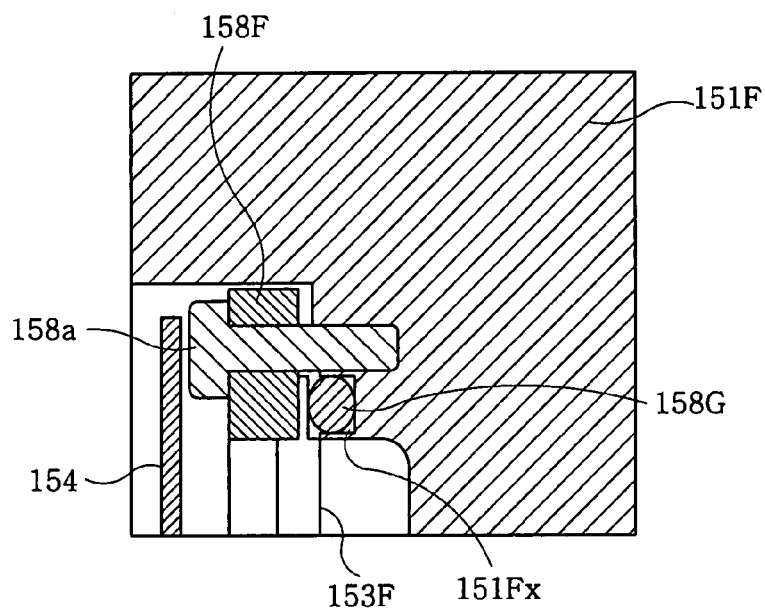
FIG. 10A sets forth an enlarged partial cross sectional view showing an example of modified configuration of the gas discharging unit.

Further, in a modified example shown in FIG. 10A, the outer peripheral portion of a filter 153F is inserted between a supporting member 158F and a seal member 158G, and the seal member 158G is accommodated in a recess portion 151F*x* provided in a part of the inner surface of the partition wall 151F and fixed thereto firmly. The supporting member 158F has a stiffness higher than that of the outer peripheral portion of the filter 153F against a load applied thereto in a pressing direction, as in the other modifications as described above. Further, in comparison with the outer peripheral portion of the filter 153F, the seal member 158G tends to be easily deformed in the pressing direction by the load imposed thereon in the pressing direction (i.e., it has a lower stiffness). Thus, the outer peripheral portion of the filter 153F is evenly pressed by the supporting member 158F over its entire perimeter, and the seal member 158G is compressed by that pressure to be firmly fixed to both of the outer peripheral portion of the filter 153F and the inner surface of the partition wall 151F.

The seal member 158G is configured such that it is easier to deform elastically in the pressing direction than the outer peripheral portion of the filter 153F. More specifically, the seal member 158G is made up of such a material as synthetic rubber that is easy to be elastically deformed. Further, it is also possible to configure the seal member 158G to be elastically deformed in the pressing direction more easily than the outer peripheral portion of the filter 153F by appropriately setting up its structure (cross sectional shape). In such a case, the coefficient of elasticity of the material for the seal member 158G itself need not necessarily be lower than that of the material used to form the outer peripheral portion of the filter 153F.

Figure 10B:
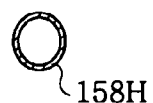
FIGS. 10B to 10D are cross sectional views showing different examples of a seal member shown in FIG. 10A.
Figure 10C:
Figure 10D:

For example, a hollow seal member 158H as shown in FIG. 10B can be employed or a seal member 158I having a cross section of an opened ring shape (C-shape or U-shape) as shown in FIG. 10C can be employed. Further, a seal member 158J having an opened box shape (quadrilateral shape opened on one side) as shown in FIG. 10D can also be employed. In order to set up the seal member to facilitate a transfer of heat to the filter, the material for the seal member is preferably metal, especially stainless steel, and a nonferrous metal such as aluminum, titanium and nickel. Herein, an inorganic material such as ceramic and quartz can also be employed. Further, in the viewpoint of facilitating the elastic deformation of the seal member, various synthetic rubbers, a fluorine-based resin such as tetrafluoroethylene, a heat resistant resin material such as a urethane-based resin and so forth can be used to form the seal member.

In this example, by the elastic deformation of the seal members 158G to 158J themselves, airtightness and tight contact between the outer peripheral portion of the filter 153F, the seal members 158G to 158J and the partition wall 151F can be obtained. Thus, it can be ensured that a source gas and residual mist is prevented from passing through the boundary between the seal member 158F and the partition wall 151F.

Figure 14:
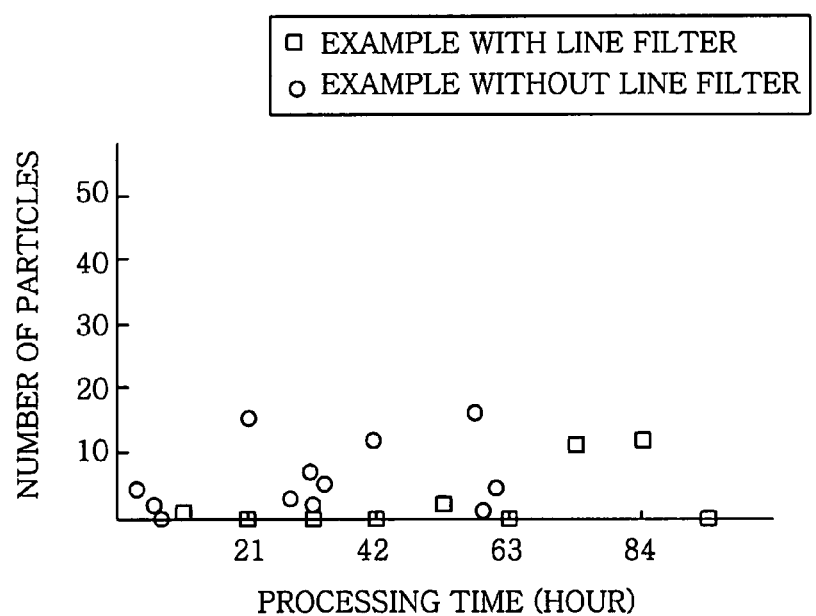
FIG. 14 shows the processing time dependency of the number of particles of the film forming apparatus in accordance with the embodiment of the present invention with and without a line filter.

FIG. 14 is a graph showing the number of particles of diameter greater than 0.2 μm present on a thin film formed on a substrate (a silicon wafer having a diameter of 8 inches) by the film forming unit 130 depending on a processing time, when employing a filter attachment mechanism in accordance with the first embodiment of the present invention. Here, data represented by blank squares describes an exemplary case with a line filter 150F on a source gas supply line, and data represented by blank circles describes another exemplary case without the line filter 150F.

As can be seen from FIG. 14, in accordance with the first embodiment, the number of particles measured is much smaller than that in a conventional case, and it is conjectured that the number of particles is reduced because no gap is generated around the filter and, thus, leakage of particles and residual mist does not occur. Further, the particle number is stably kept small in accordance with the first embodiment. In addition, the number of particles hardly fluctuates with a lapse of processing time, and it is conjectured that the number of particles is stabilized because of a significant reduction in local clogging of the filter, and it is also conjectured that the clogging of the filter is reduced because the filter experiences little reduction in the temperature of its inner portion owing to the heat transferred to the inner portion from the above-described heat transfer members and thus can vaporize mist reaching thereat efficiently. Further, the shielding effect of the shielding plate 154 also contributes to reduce clogging of the filter. Furthermore, since there is no difference in the number of particles in cases with or without the line filter 150F, it can be inferred that the suppression of particle generation depends only on the structure of the filter provided in the gas discharge unit 150X of the vaporizer 120.

Second Embodiment

A Source Gas Transport Path

In a second embodiment of the present invention, a source material vaporizing unit 120 is disposed above a film forming unit 130. A source gas transport path including a source gas transporting line 150S drawn from the source material vaporizing unit 120 and a source gas transporting line 150T is configured such that the number of bent portions thereof is as small as possible, and bending angles of respective bent portions are small. The bent portions of the transport path cause a pressure loss of the line, and the pressure loss increases as the bending angles of the bent portions increase. The pressure loss of the line may cause a fluctuation in the pressure of the source gas, increasing the possibility that the source gas is solidified in the line. For the reason, in order to reduce the amount of particles generated in the transporting line, the number of the bent portions needs to be reduced with the decrease of their angles of bending as well, as described above.

As described above, though the line filter 150F may not be disposed between the source gas transporting lines 150S and 150T, if the line filter 150F is installed therebetween, it is preferably fixed by using an annular supporting member, a seal member or the like, in a manner similar to fixing the above-described filters 153 and 153A to 153F.

Figure 11:
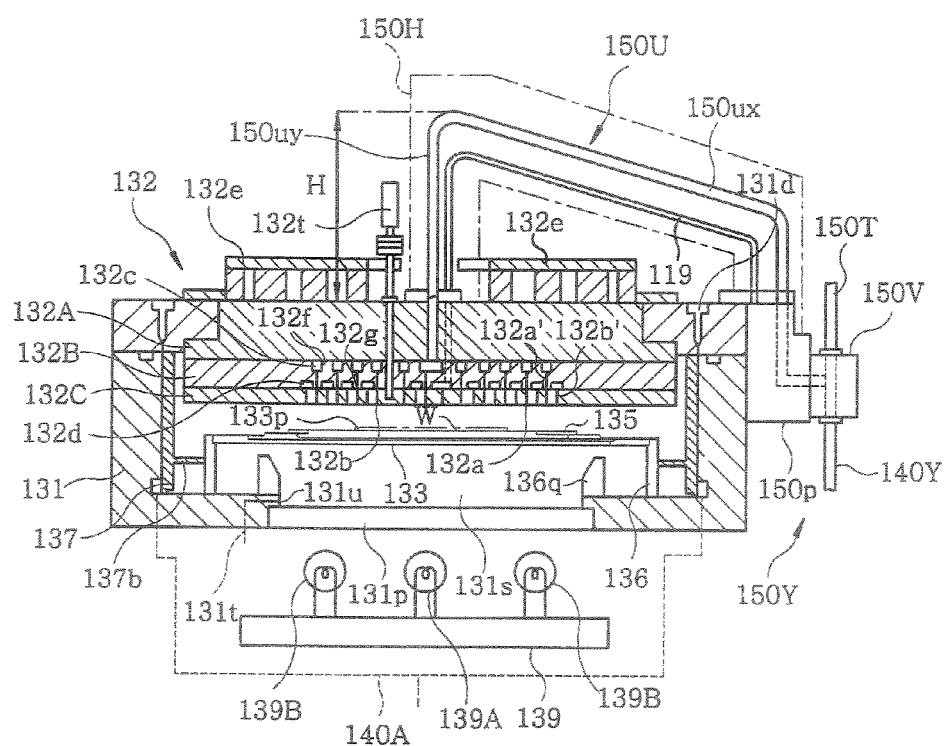
FIG. 11 is a partial cross sectional view showing major parts of a film forming unit and its vicinity.

FIG. 11 is a partial vertical cross sectional view of the film forming unit 130 in accordance with the second embodiment. As shown in FIG. 11, a gas inlet block 150Y including a gas inlet valve 150V and a valve base block 150P fixed to the film forming unit 130 is installed outside of the film forming unit 130. Here, the gas inlet valve 150V is made up of a dual diaphragm valve or the like and is configured to discharge the source gas supplied from the source gas transporting line 150T to either a source gas transporting line 150U or a bypass line 140Y by selecting one of them.

Further, a purge line 110P is connected to the source gas transporting line 150U within the gas inlet block 150Y. As described earlier, the purge line 110P (shown not in FIG. 11 but in FIG. 1) is connected to a part of the source gas transporting line 150U near the gas inlet valve 150V (gas inlet block 150Y). Specifically, as shown in FIG. 1, the purge line 110P joins the gas inlet valve 150V at a position slightly further downstream from a flow path branching portion (i.e., a base portion of the source gas transporting line 150U, which is located in the valve base block 150P in the shown example). With this configuration, a pipe volume of a part of the purge line 110P that lies between the joining position described above and the gas inlet valve 150V in the source gas transport path (which is a part of a pipe volume of the valve base block 150P) can be greatly reduced in comparison with conventional cases. For example, whereas the pipe volume of a conventional film forming apparatus was 42.1 cc (ml), it is reduced to 2.4 cc in accordance with the present embodiment.

By reducing the pipe volume, it is possible to minimize the space in which the source gas stagnates while the source gas is stopped to be supplied into the film forming unit 130. As a result, the source gas in the stagnant space can be easily diluted or replaced with the purge gas, whereby particle generation due to the stagnation of the source gas can be suppressed within the transport path. Here, the purge line 110P may also be connected directly to the gas inlet valve 150V. That is, it is possible to connect the purge line 110P to the gas inlet valve 150V at its flow path branching portion, and to set up an appropriate interconnection between the four flow paths including the source gas transporting line 150T, the source gas transporting line 150U, the purge line 110P and a bypass line 140T. In such case, there exists little space in which the source gas stagnates, whereby the particle generation in the path can be prevented more effectively.

Further, though the source material vaporizing unit 120 is disposed above the film forming unit 130 in the second embodiment, the source material vaporizing unit 120 may also be disposed in the vicinity of the gas inlet valve 150V. In such case, the source gas transport path is shortened, and thus the amount of particles generated in the source gas transport path can be further reduced.

The source gas transporting line 150U includes an ascending line portion 150*ux* extended vertically or obliquely upward from the valve base block 150P, and a descending line portion 150*uy* extended vertically downward toward the gas inlet unit 132.

By the presence of the ascending line portion 150*ux*, even when particles are included in the source gas transported from the gas inlet valve 150V into the film forming unit 130, the movement of the particles toward the downstream side is hampered in the ascending line portion 150*ux*, so that the amount of particles introduced into the film forming unit 130 can be reduced. This effect is especially great for heavy (large) particles. In practice, among the particles observed in the film forming unit 130, most of the particles introduced into the film forming unit 130 after being generated in the source gas transport path are found to be lumps of a number of small particles aggregated. The lumped particles are heavy and have large particle diameters, so they cannot easily move to the downstream side in the ascending line portion 150*ux*. Further, since such large particles have great influences on the quality of a film to be formed, the installation of the ascending line portion 150*ux* is very effective in that it contributes to the removal of large particles.

Further, since the ascending line portion 150*ux* is provided at the downstream of the gas inlet valve 150V in the vicinity of the film forming unit 130, most parts of the source gas transport path are located upstream of the ascending line portion 150*ux*. Thus, it is inferred that, since the particles generated in those most parts of the source gas transport path can be suppressed from moving to the downstream, the particles introduced into the film forming unit 130 can be further reduced.

Moreover, since a base portion of the ascending line portion 150*ux* is located at a vicinity of the gas inlet valve 150V, and the bypass line 140Y connected to the gas inlet valve 150V is extended downward, most of the particles delivered through the transport path can be efficiently discharged through the bypass line 140Y from the source gas supply line 150T via the gas inlet valve 150V during an evacuation operation. Accordingly, the possibility that the particles stagnate in the transport path during the evacuation operation is reduced, so that the particles can be prevented from heading for the film forming unit 130 during a film forming process. Here, the bypass line 140Y, which serves to exhaust unstable vaporized gas (containing particles or residual mist yet to be vaporized) in the vaporizer, is provided in order to supply stable vaporized gas into the chamber.

In the present embodiment, the descending line portion 150*uy* extended vertically downward toward the gas inlet unit 132 is set to have a sufficient height H, whereby a pressure distribution of the source gas is prevented from being uneven in the gas inlet unit 132 by inertia and changes in a moving direction of the source gas. That is, if the height H is small, although the film forming unit 130 can be easily made compact (in a smaller size), the source gas will be supplied from a lateral side (which is a right side in FIG. 11), and thus the pressure distribution of the source gas within the gas inlet unit 132 will become uneven by the inertia of the source gas and a pressure variation thereof caused by the change in the moving direction. As a result, a uniformity of the film forming process is deteriorated. Here, the uneven distribution of the pressure of the source gas is more apparent when using a gas having a heavier specific gravity. Further, although the above-mentioned aspects have been described with respect to the source gas transporting line 150U and the source gas, they are also applied to the reactant gas supply line 119 and the reactant gas.

Figure 15:
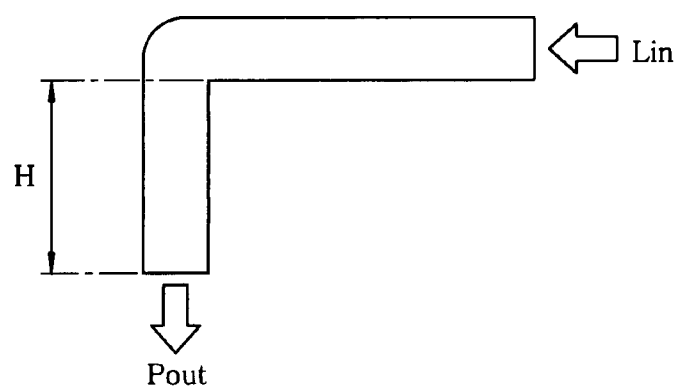
FIG. 15 is an explanatory diagram describing a precondition in investigating an influence of a height H of a descending line portion of a source gas transporting line.
Figure 16:
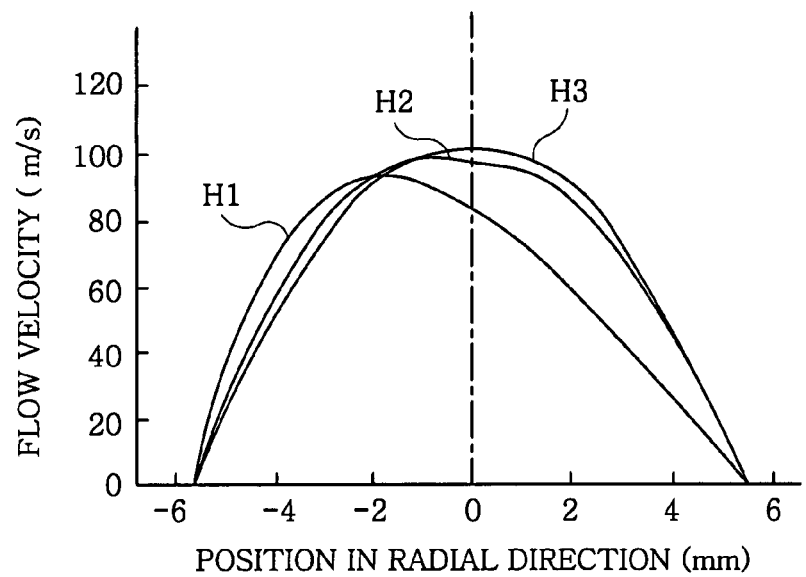
FIG. 16 sets forth a graph showing particle distributions depending on heights H of the descending line portion of the source gas transporting line.

In the present embodiment, a great height H of the descending line portion 150uy can be obtained by providing the ascending line portion 150ux. Accordingly, an inflow of particles into the film forming unit 130 and an uneven distribution of the source gas in the film forming unit 130 can be suppressed, wherein the two effects are closely related to each other. FIG. 16 is a graph showing a simulation result of a velocity distribution of a gas introduced into the film forming unit 130 from the gas inlet unit 132 while varying the height H. Herein, the simulation was conducted by making an inlet line, which is a linear pipe with an inner diameter of 11 mm, connected to the gas inlet unit 132 to be bent by 90° as shown in FIG. 15; by heating the inlet line to maintain its temperature at 210° C.; by supplying a mixture of a non-reactive gas and an organic solvent uniformly mixed in advance while controlling input flow rates Lin of the argon gas used as the non-reactive gas and butyl acetate used as the organic solvent to be maintained at 300 sccm and 1.2 ml/min, respectively, at an input side of the inlet line; and by setting an output pressure Pout at an output side of the inlet line to be maintained at about 319.2 Pa (2.4 torr).

In FIG. 16, H1, H2 and H3 represent gas velocity distributions in case the height H is set to be 46 mm, 92 mm, and 138 mm, respectively. As can be seen therefrom, when the height H of the descending line portion 150uy is small, a distribution of a film formed on a substrate is uneven because of an uneven distribution of the gas velocity. Accordingly, by increasing the height H, the film formation on the substrate can be made uniform. Since the effect of the height H on the above-described uneven distribution (uniformity) is changed depending on a gas density, the height H is adaptively set based on, e.g., the type and the temperature of the gas. The height H is preferably not smaller than 60 mm, and more preferably, not smaller than 80 mm. Further, the height H is preferably not greater than 1000 mm when the size of the apparatus is taken into consideration.

Further, the source gas transporting line 150U is formed in an arch shape as its overall structure. A connecting portion at which the vertically extended portion of the ascending line portion 150ux is connected to the obliquely inclined portion of the ascending line portion 150ux and a connecting portion at which the ascending line portion 150ux is connected to the descending line portion 150uy are formed in a mildly curved shape (having a large radius of curvature). With these configurations, the gas pressure in the source gas transporting line 150U can be prevented from being varied.

Furthermore, as shown in FIG. 11, the reactant gas supply line 119 is formed along the source gas transporting line 150U in the vicinity of the film forming unit 130 and is connected to the gas inlet unit 132. By this configuration, it is possible to provide a descending line portion similar to that of the source gas transporting line 150U, so that an uneven distribution of the reactant gas in the gas inlet unit 132 can be prevented.

Moreover, with this configuration, the reactant gas supply line 119 and the source gas transporting line 150U can be heated by a common heater block (mantle heater) 150H, whereby a heating mechanism of the line can be made up in a simple configuration. By employing these configurations described above, the source gas can be uniformly supplied into the gas inlet unit 132 and then into the processing chamber.

Third Embodiment

Configuration of a Film Forming Unit

Now, an internal configuration of a film forming unit 130 in accordance with a third embodiment of the present invention will be explained with reference to FIGS. 11 to 13. As shown in FIG. 11, the film forming unit 130 has a gas inlet unit 132 provided at a part of partition walls (a ceiling portion in the figures) of a film forming vessel 131, and a source gas and a reactant gas are introduced through the gas inlet unit 132 toward a susceptor 133 installed within the film forming unit 130. The gas inlet unit 132 has a post-mix type shower head structure provided with a plurality of source gas inlet openings 132a for the inflow of the source gas and a number of reactant gas inlet openings 132b for the inlet of the reactant gas into the film forming vessel 131.

Further, the gas inlet unit 132 has a laminated-plate structure made up of plural plates laminated on top of each other. In the shown example, the gas inlet unit 132 has a three-level structure with an upper plate 132A, an intermediate plate 132B and a lower plate 132C. The front and the rear surface of the intermediate plate 132B are provided with a recess 132c for providing a diffusion space of the source gas and a recess 132d for providing a diffusion space of the reactant gas, respectively.

In the third embodiment, the recess 132c is a single large disk-shaped recessed portion, and a plurality of columnar protrusions 132f are protruded from the bottom of the recess. Each protrusion 132f is in firm contact with the bottom surface of the upper plate 132A, whereby a desirable level of heat conductance is obtained between the intermediate plate 132B and the upper plate 132A. Likewise, the recess 132d is a single large disk-shaped recessed portion, and a number of columnar protrusions 132g are protruded from the bottom of the recess. Each protrusion 132g is in firm contact with the top surface of the lower plate 132C, whereby a desirable level of heat conductance is obtained between the intermediate plate 132B and the lower plate 132C.

Obtaining the desirable level of heat conductance between the plates 132A, 132B and 132C allows an appropriate control of the bottom surface of the lower plate 132C (i.e., the surface of the shower head), which in turn makes it possible to achieve a uniform film formation. The recess 132c is connected to a passageway connected to the source gas supply line 150U and extended through the upper plate 132A. The recess 132d is connected to a passageway connected to the reactant gas supply line 119 and extended through the upper plate 132A and the intermediate plate 132B. Further, connected to the bottom of the recess 132c is a plurality of small passageways 132a' extended through the intermediate plate 132B and the lower plate 132C and connected to the source gas inlet openings 132a opened at the bottom surface of the lower plate 132C.

Moreover, connected to the bottom of the recess 132d are a number of small passageways 132b' extended through the lower plate 132C and connected to the reactant gas inlet openings 132b opened at the bottom surface of the lower plate 132C. Further, the above recesses and protrusions can be formed at upper plate 132A's side and/or lower plate 132C's side being in contact with the intermediate plate 132B.

A heat radiation portion 132e made up of a plurality of fins, a plate structure, or the like is provided on the top surface of the gas inlet unit 132. The heat radiation portion 132e is prepared to improve heat radiation efficiency when the heat in the film forming vessel 131 is radiated via the gas inlet unit 132. By providing the heat radiation portion 132e, a flow of heat within the gas inlet unit 132 can be uniformly distributed, and the heat radiation efficiency can be improved.

As a result, controllability and uniformity of the temperature of a processing space-side portion (lower plate 132C) of the gas inlet unit 132 where the source gas inlet openings 132a and the reactant gas inlet openings 132b are provided can be improved, and temperature stabilization of a film forming area can be achieved. The temperature stabilization of the film forming area makes it possible to achieve stabilization of a reactant gas or reduction of the detachment of the particles, so that the amount of particles in the film forming unit 130 can be reduced, and fine quality of deposits can be formed.

Further, a temperature sensor 132t made up of a thermocouple or the like is provided to serve to detect a temperature of the gas inlet unit 132' portion on the side of the processing space. The temperature control of the gas inlet unit 132 can be carried out by controlling a heating unit (not shown) such as a heater installed within or on an outer surface of the gas inlet unit 132 or a cooling unit (not shown) such as a cooling fan based on a temperature detected by the temperature sensor 132t. By using the temperature sensor 132t, the processing space-side portion of the gas inlet unit 132 (surface portion of the lower plate 132C) can be further stabilized.

Moreover, the film forming vessel 131 is connected to a gas exhaust line 140A shown in FIG. 1, so that the internal pressure of the film forming vessel 131 can be depressurized to a specific pressure level. Further, a window 131p made up of a light-transmissive material such as quartz is provided at a bottom portion of the film forming vessel 131, and a lamp heater 139 disposed below the window 131p irradiates light to the susceptor 133 through the window 131p, while rotating about a vertical axis. The lamp heater 139 is configured in a manner that the intensity of heat rays of a central heating member 139A and the intensity of heat rays of a peripheral heating member 139B can be controlled independently.

With this configuration, a temperature profile of the susceptor 133 in a radial direction can be properly controlled. An annular reflector 131q is installed above the window 131p. After lamp rays penetrate the window 131p, the reflector 131q collects them on the susceptor 133, thus contributing to the effective and uniform heating of the susceptor 133. Further, a purge gas line 131t for supplying a purge gas such as Ar or $N_2$ is coupled to a space 131s partitioned by the window 131p and the susceptor 133. A plurality of purge gas inlet openings 131u are opened right above the window 131p at the bottom portion of the film forming vessel 131, wherein the openings 131u are arranged at same intervals in circumferential direction.

The purge gas line 131t and the plurality of purge gas inlet openings 131u are configured to communicate with each other via a passageway (not shown) formed within the partition wall of the film forming vessel 131. By supplying the purge gas into the space 131s, the surface of the window 131p can be prevented from being covered with undesired deposits that block the rays from the lamp heater 139. Further, a resistance heater can be employed instead of the lamp heater 139.

Figure 12A:
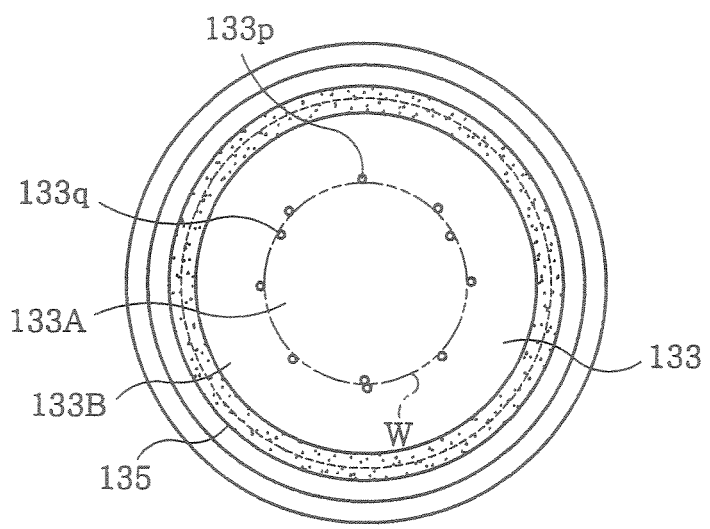
FIG. 12A depicts a plan view of a susceptor.
Figure 12B:
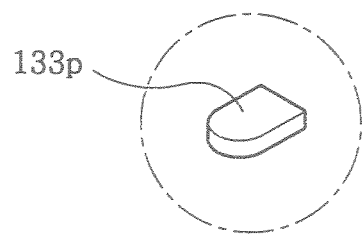
FIG. 12B shows an enlarged perspective view of a positioning protrusion.

FIG. 12A is a plane view showing the susceptor 133 and its vicinities. A substrate W is loaded on the surface of the susceptor 133, and a plurality of positioning projections for facilitating the positioning of the substrate W are provided on the surface of the susceptor 133. In this embodiment, the plurality of positioning projections 133p are arranged in a discrete manner (separately) to surround a film forming area 133A on which the substrate W is mounted. As shown in an enlarged perspective view in FIG. 12B, the positioning projections 133p are formed such that their inner side surfaces facing the substrate W have convex curve shapes (arc shapes when viewed from top).

The positioning projections 133p may also be formed in a circular or annular shape when viewed from top. Alternatively, the positioning projections 133p may be formed to have angled inner side surfaces facing the substrate W. Further, the positioning projections 133p may be configured in still other manners as long as they are not formed as a whole in a continuous annular shape surrounding the substrate W. For example, they can be implemented by, e.g., a structure of an annular positioning frame having a plurality of slits at some parts thereof. That is, the positioning projections 133p may and must be formed around a mounting area of the substrate W in a discontinuous manner or uniformly dispersed manner.

Figure 17:
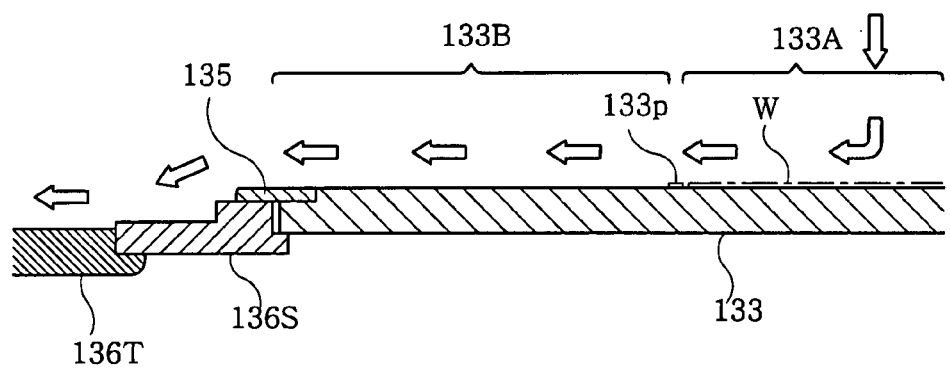
FIG. 17 depicts a vertical cross sectional view showing a part of a susceptor in accordance with an embodiment of the present invention.

The outer peripheral portion of the susceptor 133 is supported by a supporter 136 having supporting frames 136S and 136T, as illustrated in FIG. 17. In the shown example, the susceptor 133 is made up of SiC, and the supporting frame 136S and the supporting frame 136T are annularly formed of quartz and aluminum, respectively. A gas exhaust opening 136a is an opening through which a lower space of the susceptor 133 is exhausted. Further, a protection ring 135 is mounted on a connection portion of the susceptor 133 and the supporting frame 136S.

Referring to FIG. 12A, a dotted portion merely indicates the range of the protection ring 135, and it does not represent a cross section thereof. The protection ring 135 is formed of SiC. However, the materials for the susceptor 133 and the protection ring 135 are not limited to SiC but they can be other ceramic materials such as $Al_2O_3$ and AlN. The protection ring 135 is installed to cover any gap between the susceptor 133 and the supporting frame 133S, thus preventing an inflow of a processing gas in a rear surface side of the susceptor.

In the third embodiment, though the protection ring 135 and the susceptor 133 are formed as separate components, it is also preferable to form an extended portion at the outer peripheral portion of the susceptor 133 as one body with the susceptor 133 such that the extended portion is extended onto the supporting frame 136S to cover the gap between the susceptor 133 and the supporting frame 136S. In this case, since the extended portion is formed as one body with the susceptor 133, installation of the protection ring 135 is not required, and a temperature gradient at the periphery of the substrate W can be further reduced.

Figure 18:
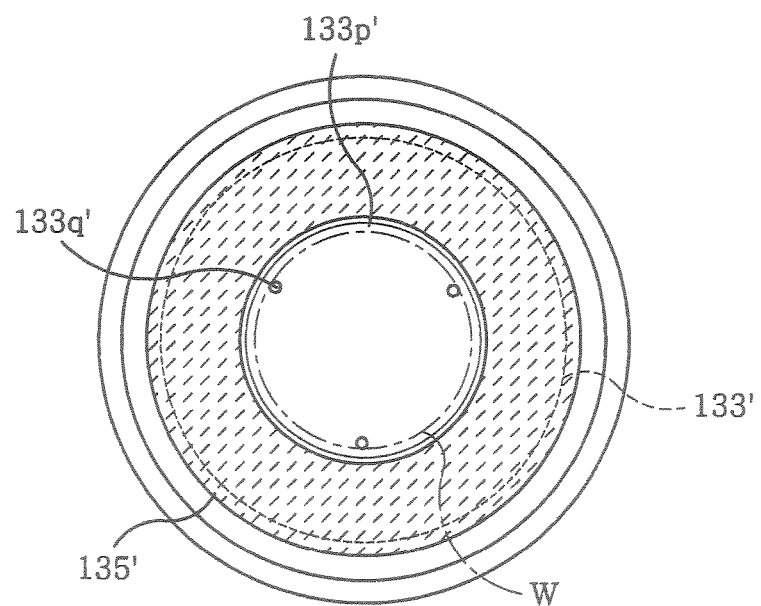
FIG. 18 presents a plan view of a conventional susceptor.
Figure 19:
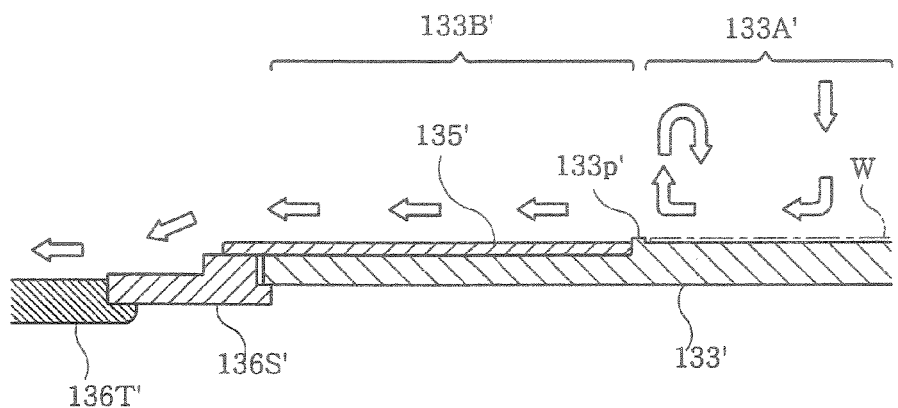
FIG. 19 provides a vertical cross sectional view showing a part of the conventional susceptor.

In a conventional configuration, a planar ring shaped positioning frame 133p' was disposed on a susceptor 133' to surround a film forming area of a substrate W, as shown in FIG. 18. Accordingly, as illustrated in FIG. 19, if there is a small gap between the substrate W and the positioning frame 133p', a part of the processing gas stagnates in the gap when the gas flows from above the substrate W toward a periphery side of the susceptor 133', and thus it becomes easier for deposits to be adhered thereto. Further, due to the presence of an inner peripheral step of the positioning frame 133p', the gas is made to flow upward, causing a turbulent gas flow. In such case, deposits (particularly, peeled-off pieces) present in the gap or on the positioning frame 133p' would be whirled up by the gas flow to be finally deposited on the substrate W as particles, resulting in deterioration of the quality of film formation.

In this embodiment, by arranging the plurality of positioning projections 133p in the discrete manner, the processing gas supplied onto the substrate W is allowed to flow toward the vicinities of the substrate W more easily, in comparison with the conventional configuration with the ring shaped positioning frame. Therefore, the above-mentioned remaining part of the processing gas is prevented, and the amount of deposits adhered around the substrate W is reduced to thereby suppress the peeling of the deposits. Further, the amount of particles, which are generated as the substrate W and the deposits are rubbed against each other, can be also reduced. In addition, since the inner side surfaces of the positioning projections 133p have the convex curve shapes, a smooth flow of the processing gas is facilitated, so that the adhesion of the deposits around the substrate W is enhanced. As a consequence, the peeled amount of the deposits and the amount of the deposits themselves can be further reduced.

The surface of the susceptor 133 is divided into the film forming area 133A on which the substrate W is mounted and an outer peripheral area positioned around the film forming area 133. The positioning projections 133p are formed between the film forming area 133A and the outer peripheral area 133B. As for the susceptor 133 in accordance with the third embodiment, the film forming area 133A and the outer peripheral area 133B are formed of a same material as a single body. Further, no other component is disposed on the surface of the susceptor 133 including an inner peripheral part of the outer peripheral area 133B as well as the film forming area 133A for mounting the substrate W thereon. Moreover, the surface of the film forming area 133A and the surface of the outer peripheral area 133B of the susceptor 133 are formed to be on a same plane (at a same height). In addition, it is also preferable that the surface of the outer peripheral area 133B is to be formed on a same plane with the surface of the substrate W mounted on the film forming area 133A.

As shown in FIGS. 18 and 19, unlike in a case where a protection ring 135' made up of SiC or the like is disposed immediately outside a film forming area 133A' (i.e., outside the positioning frame 133p'), the protection ring 135 in accordance with the third embodiment is disposed only on an outermost peripheral portion of the susceptor 133 without being positioned on the inner peripheral part of the outer peripheral area 133B. Accordingly, since no other component is present on the area ranging form the film forming area 133A to the outer peripheral area 133B, the surface of the susceptor 133 is exposed and is formed as a single plane of a same height in the above spatial range. Further, the surface of the outermost peripheral portion of the susceptor 133 is lowered by as much as the thickness of the protection ring 135, so that the surface of the protection ring 135 disposed on the outermost peripheral portion and the surface of the susceptor 133 inside it can be configured to be at a same height (with no stepped portion generated therebetween).

Further, though the susceptor 133' is formed of a high conductive material to improve temperature uniformity of the substrate W, in the configuration where the protection ring 135' is disposed adjacent to the positioning projections 133p' as shown in FIGS. 18 and 19, the outermost periphery of the substrate W is located adjacent to the protection ring 135' with the positioning frame 133p' interposed therebetween, in which case the temperature of the outermost periphery of the substrate W might decrease readily due to the influence from the protection ring 135'. To be specific, when the susceptor 133' is heated by the lamp heater 139 shown in FIG. 11, starting from its bottom portion, heat conductance between the susceptor 133' and the protection ring 133' is poor because the susceptor 133' and the protection ring 135' are merely in contact with each other or neighbor on each other via a fine gap.

As a result, the temperature of the protection ring 135' would get lower than that of the susceptor 133', causing a temperature gradient of the substrate W and resulting in a deterioration of the temperature uniformity of the substrate W. For example, under the film forming condition where the temperature of the susceptor 133' for a substrate W having a diameter of 200 mm is set to be about 650° C., the temperature of the protection ring 135' is calculated to range from 585 to 630° C. (average of 595° C.), and the temperature difference between the susceptor 133' and the protection ring 135' are found to be over 50° C. Further, the dotted portion in FIG. 18 indicates the range of the protection ring 135', and it does not represent a cross section thereof.

In the third embodiment shown in FIG. 17, a susceptor 133's region outside the positioning projections 133p not covered with the protection ring 135 is enlarged, and the protection ring 135 is configured to only cover the outermost peripheral portion of the susceptor 133. For instance, in the shown example, the positioning projections 133p are formed at locations 100 mm away from the center of the susceptor 133, while the protection ring 135 is installed such that its inner periphery is located 150 mm away from the center of the susceptor 133.

As described above, since the whole range of the susceptor 133 from the film forming area 133A to the outer peripheral area 133B are formed of the same material as the single body and, also, since the inner peripheral portion of the outer peripheral area 133B is not covered by the protection ring, the temperature of the susceptor 133 can be regulated uniformly. Particularly, since a temperature drop of the inner peripheral portion of the outer peripheral area 133B is suppressed, the adhesion of deposits in the vicinities of the substrate W is enhanced, and the peeling of the deposits due to the temperature gradient can be suppressed.

As a result, the amount of particles generated as a result of, e.g., peeling of the deposits can be further reduced. In case of performing a film formation in the conventional configuration as shown in FIGS. 18 and 19, deposits were peeled off from the positioning frame 133' or the outer peripheral area 133B'. In particular, the peeling of the deposits was obvious on the surface of the positioning frame 133'. In contrast, in case of performing a film formation in the configuration in accordance with the third embodiment, deposits are evenly adhered on the outer peripheral area 133B, including on the positioning projections 133p, and peeling of the deposits was not observed at all.

Further, in the third embodiment, as the temperature uniformity of the outer peripheral area 133B is improved as described above, the temperature distribution of the substrate W is rendered uniform, and the in-surface uniformity of film formation on the substrate and the uniformity of thin film composition are improved. In addition, since the susceptor 133 and the protection ring 135 disposed on the outermost peripheral portion of the susceptor 133 are configured such that their surfaces are at the substantially same height, no stepped portion is formed at the inner periphery of the protection ring 135, and the processing gas can be prevented from being hampered by a stepped portion. Therefore, the uniformity of film formation can be further improved.

To obtain the above-described effects, it is preferable that the inner periphery of the protection ring 135 is located at a position outwardly away from radial positions of the positioning projections 133p (or a position distanced from the center by a radius of the substrate W) by a distance equal to or greater than 30% of a radius of the film forming area 133A; and more preferably, at a position outwardly away from the center by a distance equal to or greater than 45% of the radius of the film forming area.

Figure 20:
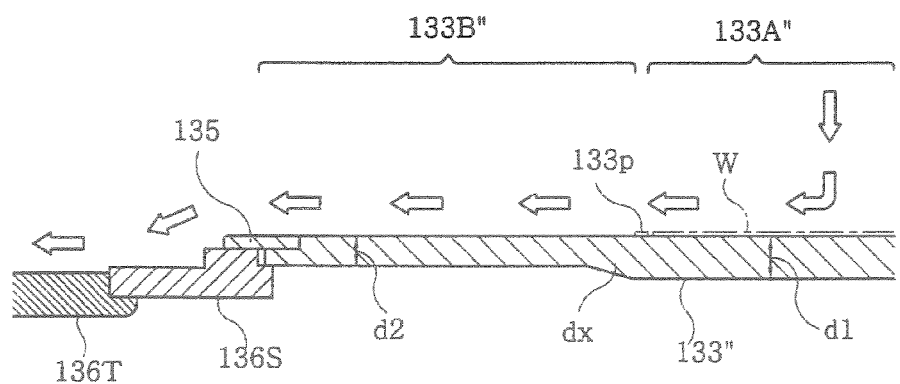
FIG. 20 is a vertical cross sectional view showing a part of a susceptor in accordance with another embodiment of the present invention.

In the third embodiment, in order to regulate the temperatures of the film forming area 133 and the outer peripheral area 133B of the susceptor 133 uniform, the lamp heater 139 is configured such that light irradiation energies of the central heating member 139A and the peripheral heating member 139B can be controlled individually. With this configuration, it is possible to control the temperature distribution of the susceptor 133 uniform with a higher precision. Further, in order to obtain the uniformity of the temperature distribution, it is possible to set the thickness d2 of an outer peripheral area 133B" of a suscepter 133" to be smaller than the thickness d1 of a film forming area 133A" on which a substrate W is mounted, as illustrated in FIG. 20.

In this configuration, since the surface temperature of the outer peripheral area 133B" of the susceptor 133" tends to increase easily, a temperature gradient in a radial direction of the substrate W, which is created due to the heat escaping to outside of the outermost periphery of the outer peripheral area 133B" (toward the supporter 136), is reduced. Further, in the configuration shown in FIG. 20, parts identical to those described in FIG. 17 are assigned same reference numerals, and their description will be omitted here.

Further, when the substrate W is loaded or unloaded, lifter pins 133q shown in FIG. 12A serve to support the substrate W, while maintaining the substrate W lifted up from the surface of the susceptor 133. In FIGS. 1, 11 and 13, the lifter pins 133q and an elevation mechanism for moving the lifter pins 133a above or below the surface of the susceptor 133 are omitted.

Figure 13:
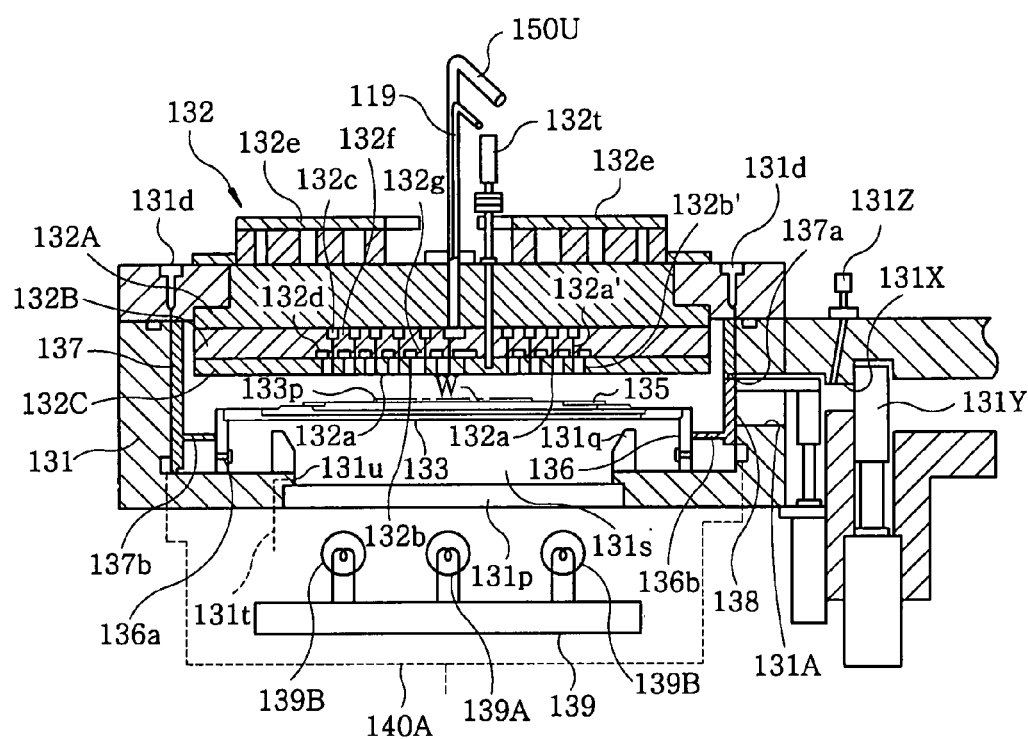
FIG. 13 presents a vertical cross sectional view showing major parts of the film forming unit.

FIG. 13 is a vertical cross sectional view of the film forming unit 131 taken in a different direction from FIG. 11. As shown in FIGS. 11 and 13, a cylindrical shield member 137 is detachably disposed on the inner surface of the film forming vessel 131 to surround the susceptor 133. The shield member 137 is made up of metal as aluminum, titanium, nickel or the like that has a good thermal conductivity, wherein the aluminum is preferred to have its surface to be aluminated. As illustrate in FIG. 13, a substrate transfer port 131A for loading or unloading of a substrate W is provided in a side portion of the film forming vessel 131. The substrate transfer port 131A is configured such that it communicates with a substrate transfer passageway 131X and is opened or closed by an opening or fclosing operation of a gate valve 131Y.

Further, provided at a shield member 137's side wall portion corresponding to the substrate transfer port 131A is an opening 137a, which is opened or closed by a vertically movable shield gate plate 138. The shield gate plate 138 is opened or closed synchronously with the gate valve 131Y. By opening the shield gate plate 138 and the gate valve 131Y, the substrate W can be loaded into or unloaded from the processing vessel 131. The shield gate plate 138 is preferably made up of the same material as that forming the shield member 137, i.e., made up of a metal having a good thermal conductivity. Since the shield member 137 is detachably installed, an operating rate and maintenance property of the film forming apparatus can be improved.

Further, a baffle portion 137b extended toward the supporter 136 is provided on an inner surface of the shield member 137. The baffle portion 137b is formed as an annular rectifying plate disposed around the film forming area. The baffle portion 137b is provided with holes for the uniform evacuation of the film forming vessel 131, and the holes have slit shapes or circular shapes. By the presence of the baffle portion 137b, the gas inside the film forming vessel 131 is rectified and is uniformly exhausted toward a gas exhaust line. Further, a baffle portion 136b provided on the side of the substrate transfer port 131A is formed separately from the baffle portion 137b. However, the baffle portions 136b and 137b may be formed as a single body.

Moreover, a purge gas such as a non-reactive gas, e.g., Ar, is introduced into a space between the inner surface of the film forming vessel 131 and the shield member 137 from an introduction port 131d, and adherence of deposits to the inner surface of the film forming vessel 131 can be prevented. As a result, the operating rate and the maintenance property of the film forming apparatus can be improved. Further, there is provided an introduction port 131Z for introducing a purge gas such as a non-reactive gas inwardly from the inside of the substrate transfer passageway 131X.

In the third embodiment, by forming the shield member 137 with metal, the heat conductivity of the shield member 137 is improved, so that deposits attached to the shield member 137 is rarely peeled off therefrom. Therefore, the amount of particles generated in the film forming vessel 131 can be reduced.

Fourth Embodiment

Configuration of a Gas Inlet Valve

Figure 21:
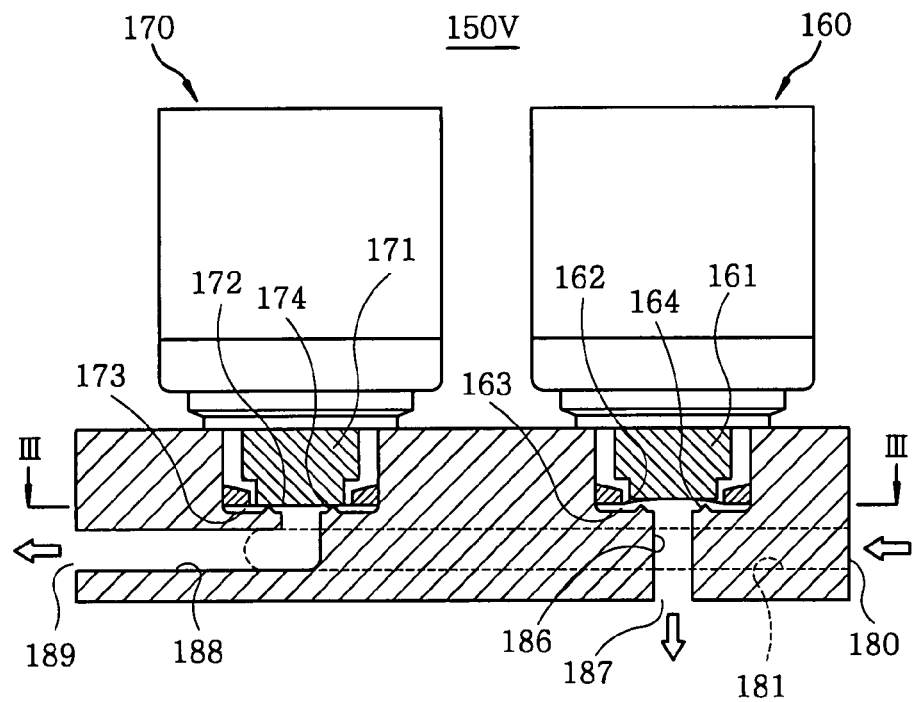
FIG. 21 offers a partial vertical cross sectional view showing a configuration of a gas inlet valve in accordance with an embodiment of the present invention.
Figure 22:
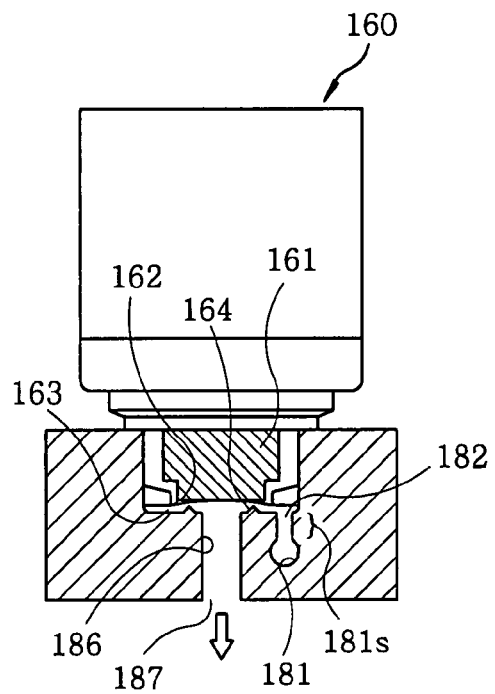
FIG. 22 depicts a partial vertical cross sectional view taken along a line II-II in FIG. 23.
Figure 23:
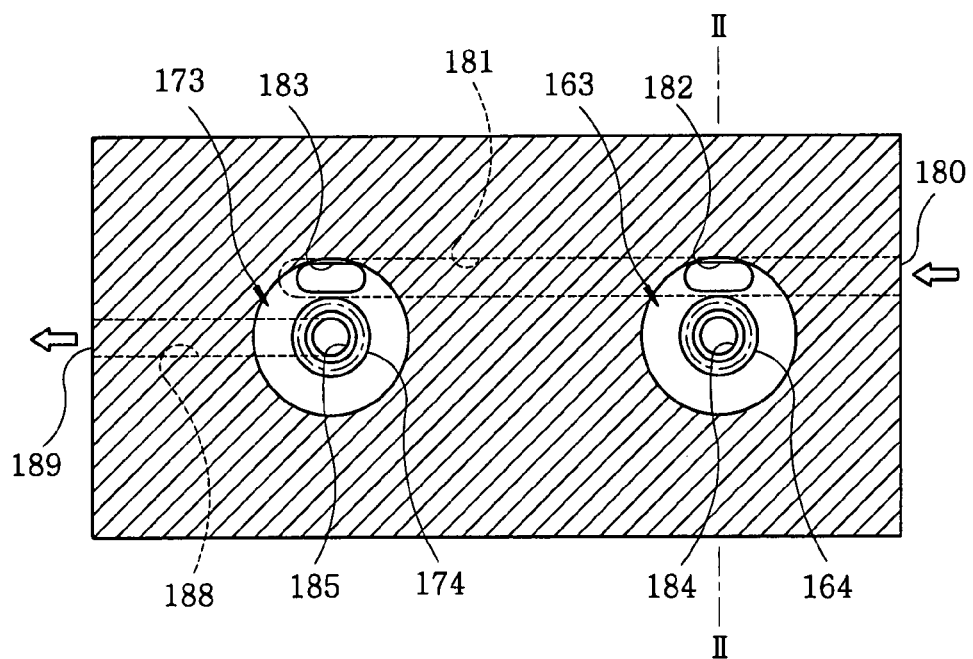
FIG. 23 is a horizontal cross sectional view taken along a line III-III in FIG. 21.

Referring to FIGS. 21 to 23, there are illustrated specific configurations of the gas inlet valve 150V. The gas inlet valve 150V has a gas inlet opening 180, a gas outlet opening 187 and a gas exhaust opening 189. The gas inlet opening 180 is connected to the source material transporting line 150T, and the gas outlet opening 187 is coupled to the film forming unit 130 (specifically, to the source gas transporting line 150U), and the gas exhaust opening 189 is connected to the bypass line 140Y. Formed in the gas inlet valve 150V is an inlet path 181 connected with the gas inlet opening 180. By an operation of a diaphragm valve 160, the inlet path 181 is set to either communicate with an outlet path 186 provided with the gas outlet opening 187 or to be isolated from the outlet path 186.

To be more specific, the inlet path 181 is opened through an opening 182 into an in-valve space (annular groove) 163 (see FIGS. 22 and 23), in which a valve body (diaphragm) 162 operated by a rod 161 (which is vertically moved by an actuator thereabove) of the diaphragm valve 160 is located, and the outlet line 186 is opened in the in-valve space 163 through an opening 184. Further, as shown in FIG. 22, a connection path 181s vertically extended between the inlet path 181 and the opening 182 is formed to have a flow path cross sectional area equal to the opening area of the opening 182. Specifically, the connection path 181s has a same opening shape and opening size as those of the opening 182.

However, if the opening area of the opening 182 is larger than the flow path cross sectional area of the inlet path 181, a connection path 181s's portion on the side of the inlet path 181 is preferably configured to have the same flow path cross sectional area as that of the inlet path 181, and the flow path cross sectional area of the connection path 181s is gradually enlarged near the opening 182 to be equivalent to the opening area of the opening 182. In the in-valve space 163, an annular rib 164 is protruded to surround the opening 184, and as the valve body 162 driven by the rod 161 comes into contact with the rib 164, the opening 184 is closed.

Further, by an operation of a diaphragm valve 170, the inlet path 181 is set to either communicate with an exhaust path 188 provided with the gas exhaust opening 189 or to be isolated from the exhaust path 188. To be more specific, the inlet path 181 is opened through an opening 183 into an in-valve space 173, in which a valve body (diaphragm) 172 operated by a rod 171 of a diaphragm valve 170 is located, and the exhaust path 188 is opened in the in-valve space 173 through an opening 185. Further, though a connection path between the inlet path 181 and the opening 183 is not shown, it is formed to have the same configuration as the connection path 181s provided between the inlet path 181 and the opening 182. In the in-valve space 173, an annular rib 174 is protruded to surround the opening 185, and as the valve body 172 driven by the rod 171 comes into contact with the rib 174, the opening 185 is closed.

In the above configuration, when the diaphragm valve 160 is opened while the diaphragm valve 170 is closed, the gas introduced from the gas inlet opening 180 flows into the outlet path 186 through the inlet path 181 to be discharged toward the film forming unit 130 via the outlet path 187. Further, when the diaphragm valve 160 is closed while the diaphragm valve 170 is opened, the gas introduced from the gas inlet opening 180 flows into the exhaust path 188 through the inlet path 181 to be exhausted through the gas exhaust opening 189.

In the gas inlet valve 150V in accordance with the embodiment of the present invention, the opening 182 opened in the in-valve space 163 of the diaphragm valve 160 and the opening 183 opened in the in-valve space 173 of the diaphragm valve 170 respectively have elongated shapes (long hole shapes as shown in the drawing), whereby the cross sectional area of the gas flow path is not reduced at the opening 182 or 183. Preferably, the opening area of the opening 182 (183) is set to be equivalent to or larger than the opening area of the opening 184 (185). Specifically, the openings 184 and 185 having the circular opening shapes are opened in the centers of the in-valve spaces 163 and 173, respectively, and the openings 182 and 183 formed in peripheral regions of the in-valve spaces 163 and 173, respectively, are formed to be elongated in a circumferential direction with respect to the openings 184 and 185. With this configuration, when the gas flows in the outlet path 186 or the exhaust path 188 through the in-valve spaces of the diaphragm valve 160 and 170 after being introduced via the inlet path 181, it is possible to prevent liquefaction or solidification of source material due to a variation of a gas pressure in the openings 182 and 183, so that generation of particles due to the liquefaction or the solidification of the source material can be suppressed.

Figure 26:
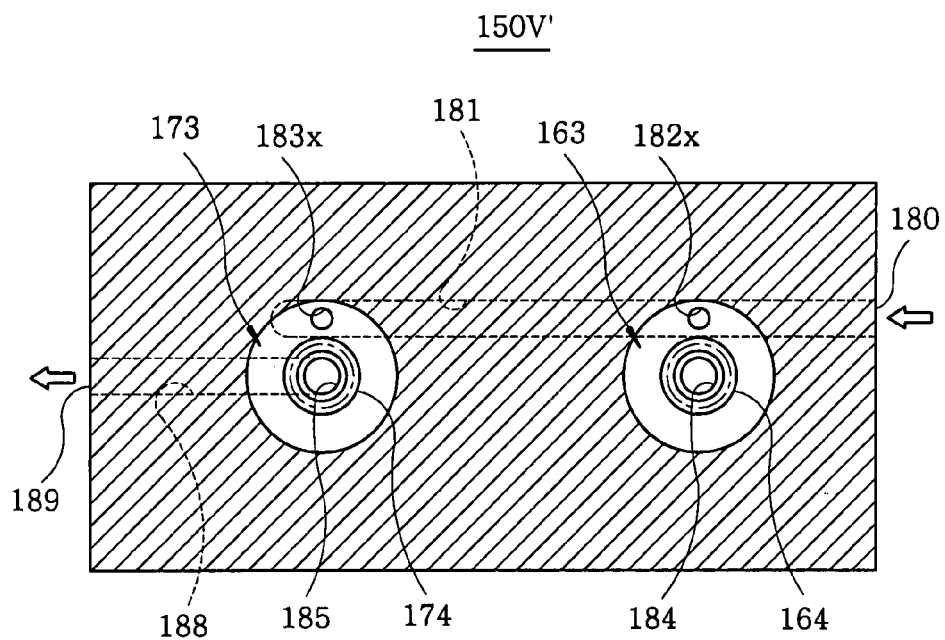
FIG. 26 sets forth a horizontal cross sectional view of a conventional gas inlet valve.

In a conventional gas inlet valve 150V' shown in FIG. 26 (here, parts identical with those shown in FIG. 23 are assigned same reference numerals), openings 182x and 183x formed in peripheral regions in in-valve spaces have circular shapes, and, since radii thereof need to be limited within a certain specified length by a structural restriction of the valve, their opening areas are set to be smaller than the cross sectional areas of the gas flow in an inlet path 181, an outlet path 186 and an exhaust path 188. Thus, similarly to a case where an orifice (contraction) is formed in a flow path, a variation in a gas pressure occurs while a gas passes through the openings 182x and 183x.

Given that the source gas (obtaining by vaporizing a liquid or solid organic metal material) tends to be readily liquefied or solidified due to a pressure variation and a temperature variation accompanied by the pressure variation, liquid droplets or solid mass would be precipitated if a pressure variation is caused in the openings 182x and 183x after the source gas is supplied through a gas inlet opening 180, thus resulting in generation of particles in the in-valve spaces 163 and 173. The particles generated in the in-valve spaces 163 and 173 are flown toward the film forming unit 130 through a gas outlet opening after passing through an outlet path, thereby causing a deterioration in the quality of film formation.

In this embodiment, however, by forming the openings 182 and 183 to have the elongated hole shapes, their opening areas can be set to be equal to or larger than the opening areas of the openings 184 and 185 in spite of a structural restriction of the valve, whereby a pressure variation can be suppressed, and generation of particles in the in-valve spaces 163 and 173 can be prevented. Here, it is also preferable to configure that only the opening 182, which is provided in the in-valve space 163 of the diaphragm valve 160 directly communicating with the film forming unit 130, has the elongated hole shape.

Figure 24:
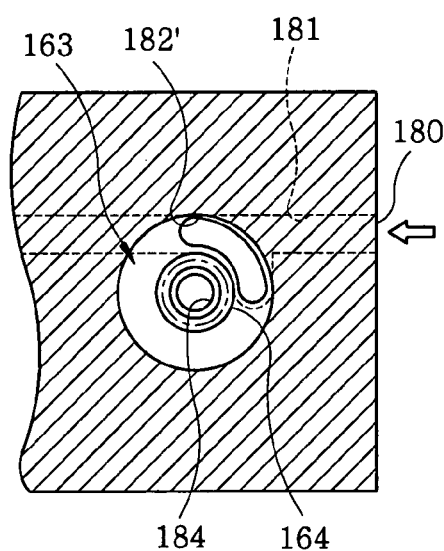
FIG. 24 provides a horizontal cross sectional view of the gas inlet valve in accordance with another embodiment.

FIG. 24 is a horizontal cross sectional view showing a shape of an opening 182' in accordance with a modification of the fourth embodiment. Here, parts identical to those described in FIG. 23 are assigned same reference numerals. The opening 182' has an opening shape elongated around the center of the in-valve space 163 or elongated along an annular grove in the valve to have a bow shape (arced shape as shown in the drawing). By forming the opening 182' to have such a shape, the opening area of the opening 182' can be more freely set regardless of the structural restriction of the valve. Thus, generation of particles in the valve chamber can be further suppressed.

Figure 25:
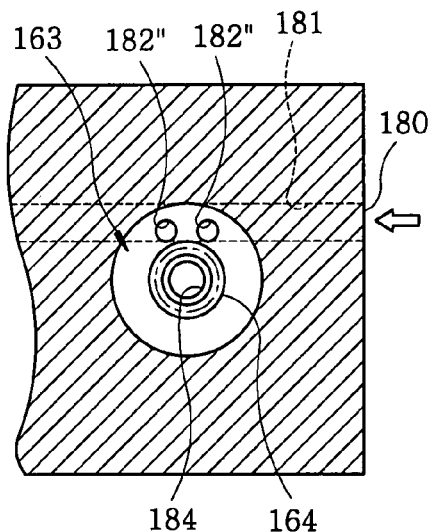
FIG. 25 presents a horizontal cross sectional view of the gas inlet valve in accordance with still another embodiment.

FIG. 25 is a horizontal cross sectional view showing a shape of openings 182" in accordance with another modification of the fourth embodiment. Here, parts identical to those described in FIG. 23 are assigned same reference numerals. The openings 182" are disposed at plural (two in the drawing) locations around the center of the in-valve space 163. Here, the plural openings 182" are arranged in a circumferential direction around the in-valve space 163. It is preferable to set the entire opening areas obtained by the openings 182" to be equal to or larger than the opening area of an opening 184. In this configuration, generation of particles in the valve chamber can be further suppressed.

In particular, the peripheral openings 182 and 183 are preferred to have opening areas equal to or larger than the opening areas of the central openings 184 and 185, respectively. By setting their opening areas as such, a pressure variation that might be caused by those openings can be prevented, so that generation of particles can be further suppressed. However, even though the opening areas of the peripheral openings 182 and 183 are not perfectly equal to the opening areas of the central openings 184 and 185, respectively, the above effect can be obtained as long as the difference of the opening areas between them is within a range of ±10%, and a higher effect can be obtained if the difference is within a range of ±5%. Further, it is preferable that a pressure variation of the source gas in the flow path ranging from the inlet path 181 to the outlet path 186 is within a range of ±20%; and more particularly, within a range of ±10%.

As for the gas inlet valve 150V described above, the openings 182 and 183 provided around the openings 184 and 185 in the center of the in-valve spaces 163 and 173 are configured to have hole shapes elongated in the circumferential direction of the central openings 184 and 185 or a plurality of openings 182 and 183 are provided in the circumferential direction of the central openings 184 and 185, respectively. Thus, sufficient opening areas of the peripheral openings 182 and 183 can be obtained, whereby a pressure variation of the source gas can be suppressed when the gas passes through the openings 182 and 183. As a result of preventing the pressure variation, liquefaction or solidification of the source gas can be prevented, so that generation of particles can be suppressed.

In particular, in order to prevent condensation or solidification of a depressurized liquid source material or a source gas obtained by vaporizing a solid or liquid source material, they need to be supplied through a supply path in which no pressure difference is caused. Accordingly, the above-described valve structure is preferred as a valve structure installed on the supply path. An organic metal compound containing a metal element such as Pb, Zr, Ti, Ba, Sr, Ru, Re, Hf or Ta or an oxide thereof; an inorganic metal compound such as a chloride or a fluoride containing a metal element such as Ti, Ta or W; or the like can be exemplified as those source materials.

In general, in order to obtain sufficient opening areas of the peripheral openings 182 and 183, the opening areas of the central openings 184 and 185 need to be set small or the in-valve spaces 163 and 173 need to be set large. If the opening areas of the central openings 184 and 185 are set to be small, however, the flow path cross sectional areas of the diaphragm valves 160 and 170 are also reduced, and a pressure variation is caused because the cross sectional areas of the openings 184 and 185 are reduced smaller than the flow path cross sectional area of the outlet path 186 or the exhaust path 188. The pressure variation would cause a generation of particles.

Further, if the in-valve spaces 163 and 173 are enlarged, a difference in the flow path cross sectional areas between the valve chamber and the inlet path 181 and the outlet path 186; or between the valve chamber and the exhaust path 188 is increased, whereby a pressure variation and the like would be triggered, and the entire structures of the diaphragm valves 160 and 170 will be enlarged, in which case a large driving force is required to drive the valve bodies 162 and 172.

In the gas inlet valve 150V in accordance with the fourth embodiment of the present invention, the opening areas of the peripheral openings 182 and 183 can be increased without reducing the opening areas of the central openings 184 and 185 or enlarging the in-valve spaces 163 and 173, thus suppressing a pressure variation or a temperature variation of the gas within the diaphragm valves 160 and 170.

What is claimed is:

1. A film forming apparatus comprising:
   a source material supply unit for supplying source material of liquid or gas-liquid mixture;
   a source material vaporizing unit for generating a source gas by vaporizing the source material; and
   a film forming unit for performing a film formation by using the generated source gas,
   wherein a filter is installed in a transport path of the source gas extending from the source material vaporizing unit to an introduction portion of the film forming unit,
   wherein an outer peripheral portion of the filter is pressed over an entire perimeter thereof against an inner surface of the transport path by an annular supporting member that is not deformed more easily than the outer peripheral portion by a load imposed in a pressing direction, so that the outer peripheral portion is fixed to the inner surface of the transport path while being compressed between the inner surface of the transport path and the supporting member,
   wherein the outer peripheral portion of the filter includes a recess or a protrusion, as viewed from a cross section in a diametrical direction of the filter,
   wherein a surface of the supporting member in contact with the outer peripheral portion of the filter includes a recess or a protrusion, as viewed from the cross section in the diametrical direction of the filter, the recess or the protrusion of the supporting member being in firm contact with the outer peripheral portion of the filter, and
   wherein the inner surface of the transport path in contact with the outer peripheral portion of the filter includes a recess or a protrusion, as viewed from the cross section in the diametrical direction of the filter, the recess or the protrusion of the transport path being in firm contact with the outer peripheral portion of the filter.

2. The apparatus of claim 1, wherein the outer peripheral portion of the filter is made of filter material itself.

3. The apparatus of claim 1, wherein the outer peripheral portion of the filter is formed of an outer peripheral member, the outer peripheral member being made of a material other than filter material disposed at an inner part of the filter and connected to the filter material without any gap therebetween.

4. The apparatus of claim 1, wherein a heat transfer member for heating the filter is in contact with an inner part of the outer peripheral portion.

5. The apparatus of claim 1, wherein the transport path of the source gas has an ascending line portion extended vertically or obliquely upward.

6. The apparatus of claim 1, wherein a gas inlet valve that permits and stops the supply of the source gas to the film forming unit is installed in the transport path, and a purge line for introducing a purge gas is connected to the gas inlet valve or to a location at a side of the film forming unit near the gas inlet valve.

7. The apparatus of claim 1, wherein the film forming unit includes a shield member made of metal installed around a mounting member having a film forming area on which a substrate is to be mounted.

8. The apparatus of claim 1, wherein the film forming unit includes a mounting member having a film forming area on which a substrate is to be mounted, and a plurality of positioning projections for positioning the substrate are formed around the film forming area discretely.

9. The apparatus of claim 8, wherein a region of the mounting member from the film forming area to an outside of the positioning projections is made of a same material and formed as a single body, and is not covered with other parts.

10. A film forming apparatus comprising:
    a source material supply unit for supplying source material of liquid or gas-liquid mixture;
    a source material vaporizing unit for generating a source gas by vaporizing the source material; and
    a film forming unit for performing a film formation by using the generated source gas,
    wherein a filter is installed in a transport path of the source gas extending from the source material vaporizing unit to an introduction portion of the film forming unit,
    wherein an outer peripheral portion of the filter is pressed against and fixed to an inner surface of the transport path by an annular supporting member disposed at one side of the outer peripheral portion via an annular seal member disposed at the other side of the outer peripheral portion in direct contact with the inner surface of the transport path,
    wherein the supporting member is configured not to be deformed more easily than the outer peripheral portion by a load imposed in a pressing direction, and the annular seal member is configured to be deformed in the pressing direction more easily than the outer peripheral portion by the load imposed in the pressing direction, wherein the annular seal member is accommodated in a recess portion provided in the inner surface of the transport path, and wherein the annular seal member is made of a heat transferable material.

11. The apparatus of claim 10, wherein the outer peripheral portion of the filter is made of filter material itself.

12. The apparatus of claim 10, wherein the outer peripheral portion of the filter is formed of an outer peripheral member, the outer peripheral member being made of a material other than filter material disposed at an inner part of the filter and connected to the filter material without any gap therebetween.

13. The apparatus of claim 10, wherein a heat transfer member for heating the filter is in contact with an inner part of the outer peripheral portion.

14. The apparatus of claim 10, wherein the transport path of the source gas has an ascending line portion extended vertically or obliquely upward.

15. The apparatus of claim 10, wherein a gas inlet valve that permits and stops the supply of the source gas to the film forming unit is installed in the transport path, and a purge line for introducing a purge gas is connected to the gas inlet valve or to a location at a side of the film forming unit near the gas inlet valve.

16. The apparatus of claim 10, wherein the film forming unit includes a shield member made of metal installed around a mounting member having a film forming area on which a substrate is to be mounted.

17. The apparatus of claim 10, wherein the film forming unit includes a mounting member having a film forming area on which a substrate is to be mounted, and a plurality of positioning projections for positioning the substrate are formed around the film forming area discretely.

18. The apparatus of claim 17, wherein a region of the mounting member from the film forming area to an outside of the positioning projections is made of a same material and formed as a single body, and is not covered with other parts.

19. A film forming apparatus comprising:

a source material supply unit for supplying source material of liquid or gas-liquid mixture;

a source material vaporizing unit for generating a source gas by vaporizing the source material; and a film forming unit for performing a film formation by using the generated source gas, wherein a filter is installed in a transport path of the source gas extending from the source material vaporizing unit to an introduction portion of the film forming unit, wherein an outer peripheral portion of the filter is formed of an annular outer peripheral member, wherein the outer peripheral member is airtightly connected to an outer peripheral part of a filter material disposed inside the outer peripheral portion, wherein the outer peripheral member is configured not to be deformed more easily than the filter material by a load imposed in a pressing direction, and is fixed to an inner surface of the transport path, wherein the outer peripheral member is of a solid metal that is air impermeable, wherein the outer peripheral member has a uniform cross sectional shape over a perimeter thereof, and wherein the filter including the outer peripheral portion and the filter material is formed as a single body.

20. The apparatus of claim 19, wherein a heat transfer member for heating the filter is in contact with an inner part of the outer peripheral portion.

21. The apparatus of claim 19, wherein the transport path of the source gas has an ascending line portion extended vertically or obliquely upward.

22. The apparatus of claim 19, wherein a gas inlet valve that permits and stops the supply of the source gas to the film forming unit is installed in the transport path, and a purge line for introducing a purge gas is connected to the gas inlet valve or to a location at a side of the film forming unit near the gas inlet valve.

23. The apparatus of claim 19, wherein the film forming unit includes a shield member made of metal installed around a mounting member having a film forming area on which a substrate is to be mounted.

24. The apparatus of claim 19, wherein the film forming unit includes a mounting member having a film forming area on which a substrate is to be mounted, and a plurality of positioning projections for positioning the substrate are formed around the film forming area discretely.

25. The apparatus of claim 24, wherein a region of the mounting member from the film forming area to an outside of the positioning projections is made of a same material and formed as a single body, and is not covered with other parts.

* * * * *